(12) United States Patent
Okabe et al.

(10) Patent No.: US 12,317,696 B2
(45) Date of Patent: May 27, 2025

(54) DISPLAY DEVICE

(71) Applicant: SHARP KABUSHIKI KAISHA, Sakai (JP)

(72) Inventors: Tohru Okabe, Sakai (JP); Shinsuke Saida, Sakai (JP); Shinji Ichikawa, Sakai (JP); Ryosuke Gunji, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 546 days.

(21) Appl. No.: 17/795,407

(22) PCT Filed: Jan. 30, 2020

(86) PCT No.: PCT/JP2020/003552
§ 371 (c)(1),
(2) Date: Jul. 26, 2022

(87) PCT Pub. No.: WO2021/152799
PCT Pub. Date: Aug. 5, 2021

(65) Prior Publication Data
US 2023/0062563 A1    Mar. 2, 2023

(51) Int. Cl.
*H10K 59/123*   (2023.01)
*H10K 59/121*   (2023.01)
(Continued)

(52) U.S. Cl.
CPC ....... *H10K 59/123* (2023.02); *H10K 59/1213* (2023.02); *H10K 59/124* (2023.02); *H10K 59/8731* (2023.02)

(58) Field of Classification Search
CPC ........ H05B 33/12; H05B 33/22; H05B 33/02; H05B 33/26; H10K 59/8731;
(Continued)

(56) References Cited

U.S. PATENT DOCUMENTS

| | | | |
|---|---|---|---|
| 2019/0121596 A1* | 4/2019 | Maruyama | ............ G06F 3/1446 |
| 2020/0312832 A1* | 10/2020 | Chi | ..................... H10K 59/1315 |
| 2021/0134899 A1* | 5/2021 | Peng | ..................... H10K 77/111 |

FOREIGN PATENT DOCUMENTS

| | | | | |
|---|---|---|---|---|
| CN | 110047879 A | * | 7/2019 | ........... H10K 59/121 |
| CN | 110148621 A | * | 8/2019 | ......... H01L 27/3218 |
| JP | 2018124457 A | | 8/2018 | |

* cited by examiner

*Primary Examiner* — Telly D Green
(74) *Attorney, Agent, or Firm* — ScienBiziP, P.C.

(57) ABSTRACT

A display device includes: a substrate; a thin film transistor layer including a plurality of thin film transistors; a light-emitting element layer including a plurality of light-emitting elements; a display region; and an electronic component disposed on a back face side of the display region, wherein the light-emitting element layer includes a first electrode, an edge cover, a light-emitting function layer, and a second electrode, the plurality of light-emitting elements include a first light-emitting element and a second light-emitting element located in the second display region, an area of the first electrode of the second light-emitting element is smaller than an area of the first electrode of the first light-emitting element, a first contact hole is located at a position overlapping with the edge cover, and a second contact hole is located at a position corresponding to the opening of the edge cover.

14 Claims, 18 Drawing Sheets

(51) Int. Cl.
*H10K 59/124* (2023.01)
*H10K 59/80* (2023.01)
(58) Field of Classification Search
CPC ....... H10K 2102/103; H10K 2102/351; H10K 59/1213; H10K 59/122; H10K 59/123; H10K 59/124; H10K 59/131; H10K 59/60; H10K 59/80517; H10K 59/80518
See application file for complete search history.

DISPLAY DEVICE

TECHNICAL FIELD

The technique of the disclosure relates to a display device.

BACKGROUND ART

In recent years, self-luminous type organic Electro Luminescence (hereinafter also referred to as EL) display devices using organic EL elements have attracted attention as display devices that can replace liquid crystal display devices.

Each of the organic EL elements includes a first electrode, an organic EL layer provided on the first electrode, and a second electrode provided on the organic EL layer. As the organic EL element, a top-emitting type organic EL element having an excellent light extraction efficiency is suitably employed. In the top-emitting type organic EL element, the first electrode includes a reflective conductive layer that is formed of a reflective conductive material and reflects light emitted by the organic EL layer toward the second electrode side.

When the organic EL display device is used as a display of an information terminal such as a smartphone or a tablet terminal, or when it is used as a display for performing bidirectional communication such as a television telephone or a television conference, the organic EL display device is combined with a camera (so-called in-camera) that captures an image of the front face side of the display on which an image is displayed. In such an organic EL display device provided with the in-camera, it has been proposed to dispose the camera at a position overlapping with a display region on the back face side of the organic EL display device (see PTL 1, for example).

CITATION LIST

Patent Literature

PTL 1: JP 2018-124457 A

SUMMARY

Technical Problem

In an organic EL display device including top-emitting type organic EL elements, since external light is reflected by a reflective conductive layer constituting a first electrode, the transmittance of light transmitted through a display region is significantly low. Because of this, when an electronic component, such as a camera that utilizes the light transmitted through the display region, is disposed at a position overlapping with the display region on the back face side of the organic EL display device, it is desired to increase the transmittance of light in a region, of the display region, that transmits the light utilized by the electronic component.

Thus, it is conceivable to form the first electrode differently for a first display region that forms a general region of the display region, and for a second display region that is positioned inside the first display region and transmits the light utilized by the electronic component. Specifically, it is conceivable to cause the area of the first electrode in the second display region to be smaller than the area of the first electrode in the first display region. In this way, in the second display region, an amount of external light reflected by the first electrode can be reduced to increase an amount of transmitted light, and the transmittance of light utilized by the electronic component can be increased.

Incidentally, in a subpixel constituting the display region, the size of a light-emitting region that emits light by light emitted by the organic EL element is limited by the area of the first electrode. Thus, when the area of the first electrode in the second display region is caused to be smaller than the area of the first electrode in the first display region, in the subpixel of the second display region, the size of the light-emitting region becomes smaller than in the subpixel of the first display region, and thus the luminance decreases. Such a decrease in the luminance of the subpixel in the second display region can be a factor that causes the display quality of the organic EL display device to deteriorate.

The technique of the disclosure has been made in view of such a point as described above, and the object of the disclosure is to increase the transmittance of light in a second display region that is utilized by an electronic component in a display region of a display device, and to suppress a decrease in luminance of a subpixel in the second display region.

Solution to Problem

The technique of the disclosure relates to a display device including a substrate, a thin film transistor (hereinafter will be referred to as "TFT") layer provided on the substrate and including a plurality of TFTs, and a light-emitting element layer provided on the TFT layer and including a plurality of light-emitting elements. In the display device, a display region is provided that is configured to display an image by light emission from the plurality of light-emitting elements controlled by an action of the TFT, and an electronic component is disposed on a back face side of the display region with respect to the substrate and is configured to utilize light transmitted through the light-emitting element layer, the TFT layer and the substrate.

In the display device according to the technique of the disclosure, the TFT layer further includes a flattening film covering the plurality of TFTs. The light-emitting element layer includes a first electrode provided for each of the light-emitting elements on the flattening film, an edge cover covering a peripheral portion of the first electrode and including an opening exposing the first electrode, a light-emitting function layer provided on the first electrode inside the opening of the edge cover, and a second electrode provided on the light-emitting function layer. The first electrode is electrically connected to the TFT via a contact hole formed for each of the plurality of light-emitting elements in the flattening film. The display region includes a first display region, and a second display region located inside the first display region and configured to transmit light utilized by the electronic component.

In the display device according to the disclosure, the plurality of light-emitting elements include a first light-emitting element located in the first display region and a second light-emitting element located in the second display region. An area of the first electrode of the second light-emitting element is smaller than an area of the first electrode of the first light-emitting element. Of a plurality of the contact holes, a first contact hole configured to electrically connect the first electrode of the first light-emitting element to the thin film transistor is located at a position overlapping with the edge cover, and a second contact hole configured to electrically connect the first electrode of the second light-emitting element to the thin film transistor is located at a position corresponding to the opening of the edge cover. The first electrode, the light-emitting function layer, and the second electrode of the second light-emitting element are provided in a region including an inside of the second contact hole in the flattening film.

Advantageous Effects of Disclosure

According to the display device according to the technique of the disclosure, since the area of the first electrode of the second organic light-emitting element is smaller than the area of the first electrode of the first organic light-emitting element, in the second display region, an amount of external light reflected by the first electrode can be reduced to increase an amount of light transmitted therethrough, and increase the transmittance of light utilized by the electronic component. Further, since the first contact hole connecting the first electrode of the first light-emitting element to the TFT is located at the position overlapping with the edge cover, the first electrode, the light-emitting function layer, and the second electrode of the first light-emitting element are not provided inside the first contact hole.

On the other hand, the second contact hole electrically connecting the first electrode of the second light-emitting element to the TFT is located at the position corresponding to the opening of the edge cover. Then, since the first electrode, the light-emitting function layer, and the second electrode of the second light-emitting element are provided in the region, of the flattening film, including the inside of the second contact hole, the second light-emitting element can emit light inside the second contact hole. As a result, since the substantial light-emitting area of the second light-emitting element is increased compared to a case in which the second light-emitting element cannot be caused to emit light inside the second contact hole, a reduction in the luminance of the subpixel in the second display region can be suppressed.

DESCRIPTION OF EMBODIMENTS

Figure 1:
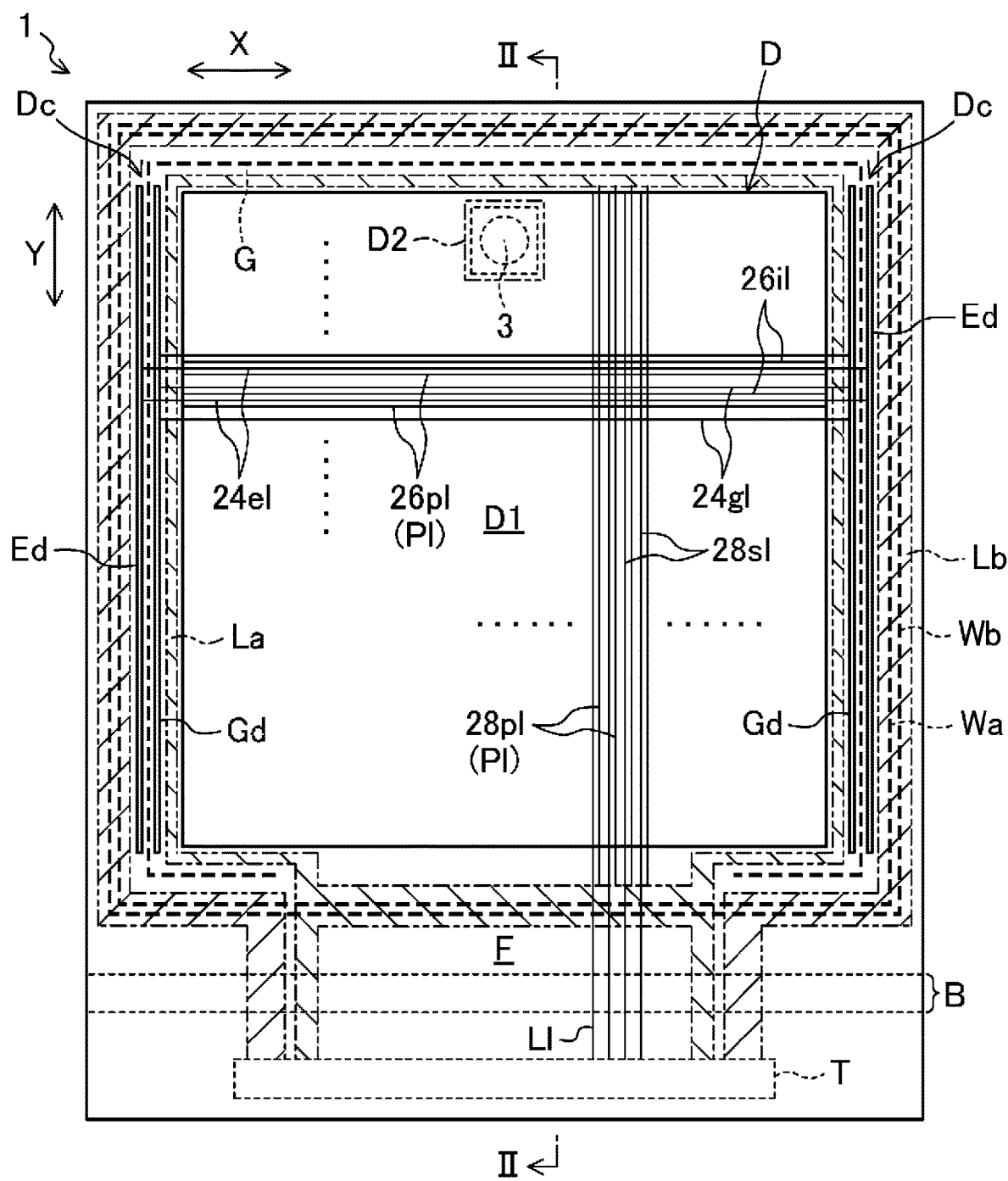
FIG. 1 is a plan view illustrating a schematic configuration of an organic EL display device according to a first embodiment.

Exemplary embodiments will be described below in detail with reference to the drawings. In the following embodiments, an organic EL display device including organic EL elements will be described as an example of a display device according to the technique of the disclosure.

Note that, in the following embodiments, a description stating that a constituent element such as a film, layer, element, or the like is provided or formed on another constituent element such as another film, layer, element, or the like means not only a case in which a constituent element is provided directly on another constituent element, but also a case in which still another constituent element such as still another film, layer, element, or the like is interposed between the constituent element and the other constituent element.

Further, in the following embodiments, a description stating that a constituent element such as a film, layer, element, or the like is connected to another constituent element such as another film, layer, element, or the like means that the constituent element and the other constituent element are electrically connected to each other unless otherwise stated. This description means, without departing from the gist of the technique of the disclosure, not only a case in which a constituent element is directly connected to another constituent element, but also a case in which a constituent element and another constituent element are indirectly connected to each other with still another constituent element such as still another film, layer, element, or the like interposed therebetween. This description also includes a case in which a constituent element is integrated with another constituent element, namely, a part of a constituent element constitutes another constituent element.

Further, in the following embodiments, a description stating that a constituent element such as a film, layer, element, or the like is in the same layer as another constituent element such as another film, layer, element, or the like means that the constituent element and the other constituent element are formed by the same process. A description stating that a constituent element such as a film, layer, element, or the like is in a lower layer than another constituent element such as another film, layer, element, or the like means that the constituent element is formed by an earlier process than that of the other constituent element. A description stating that a constituent element such as a film, layer, element, or the like is in an upper layer than another constituent element such as another film, layer, element, or the like means that the constituent element is formed by a later process than that of the other constituent element.

Further, in the following embodiments, a description stating that a constituent element such as a film, layer, element, or the like is identical or equivalent to another constituent element such as another film, layer, element, or the like means not only a state in which the constituent element and the other constituent element are completely identical or completely equivalent to each other, but also a state in which the constituent element and the other constituent element are substantially identical or substantially equivalent to each other within a range in which they vary due to manufacturing variations or tolerable errors.

Further, in the following embodiments, terms "first", "second", "third" . . . are used to distinguish objects to which those terms are attached, and do not limit the number of objects or an order of the objects in any way.

First Embodiment

Figure 2:
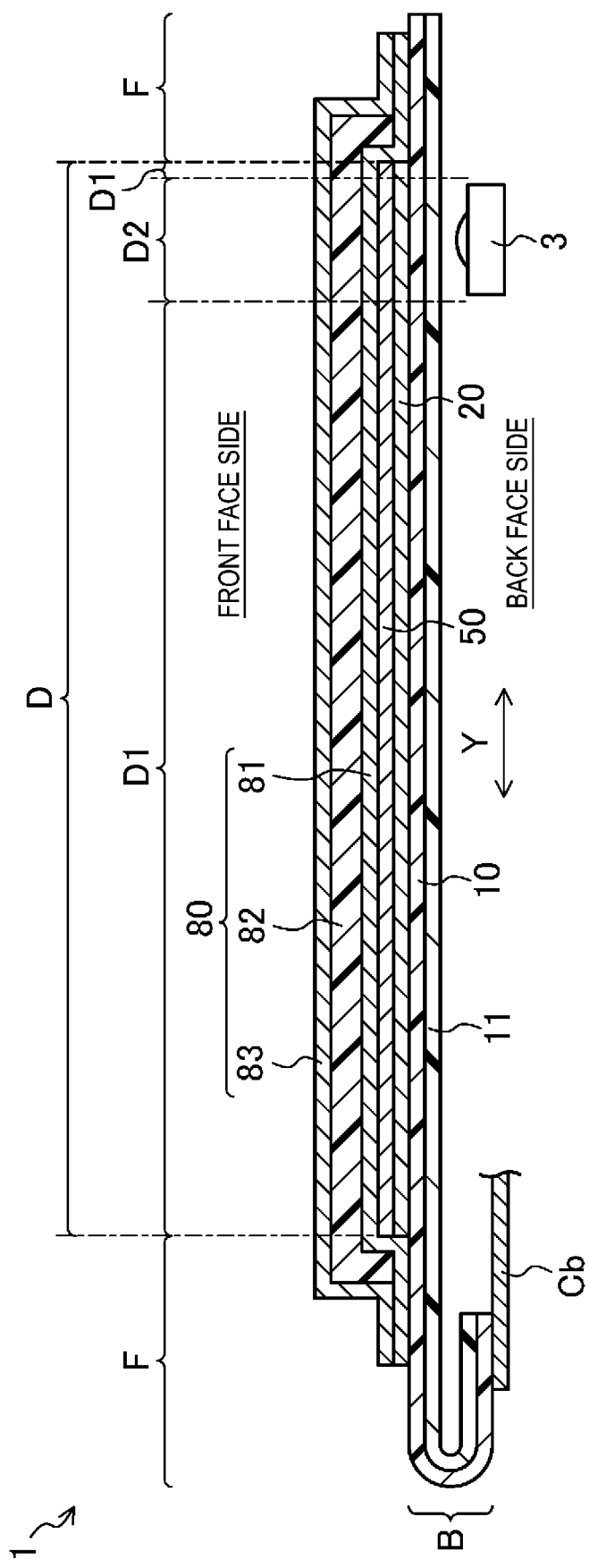
FIG. 2 is a cross-sectional view of the organic EL display device at a section along a line II-II in FIG. 1.
Figure 3:
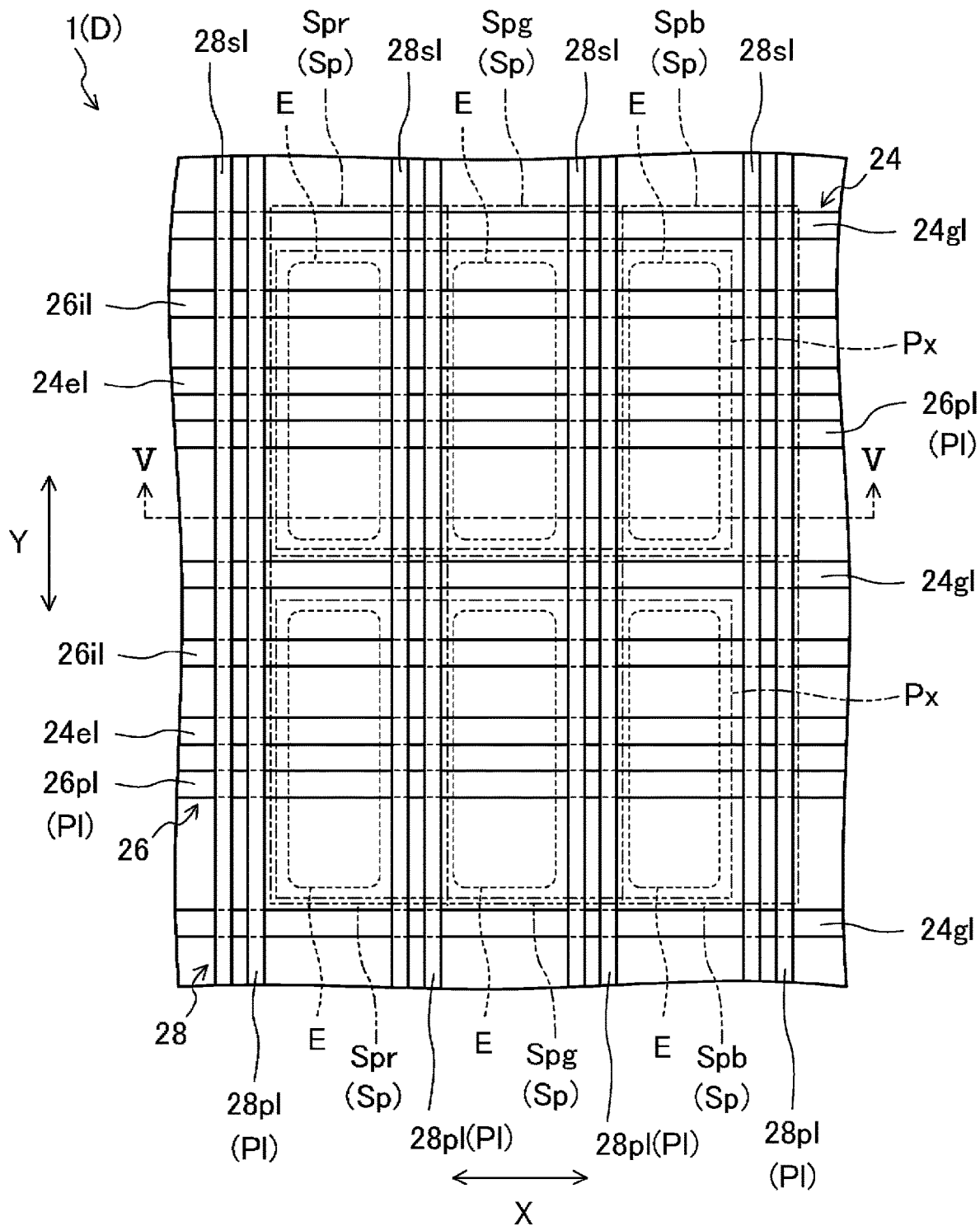
FIG. 3 is a plan view illustrating pixels constituting a display region of the organic EL display device, and display wiring lines of each of a first conductive layer, a second conductive layer, and a third conductive layer.
Figure 4:
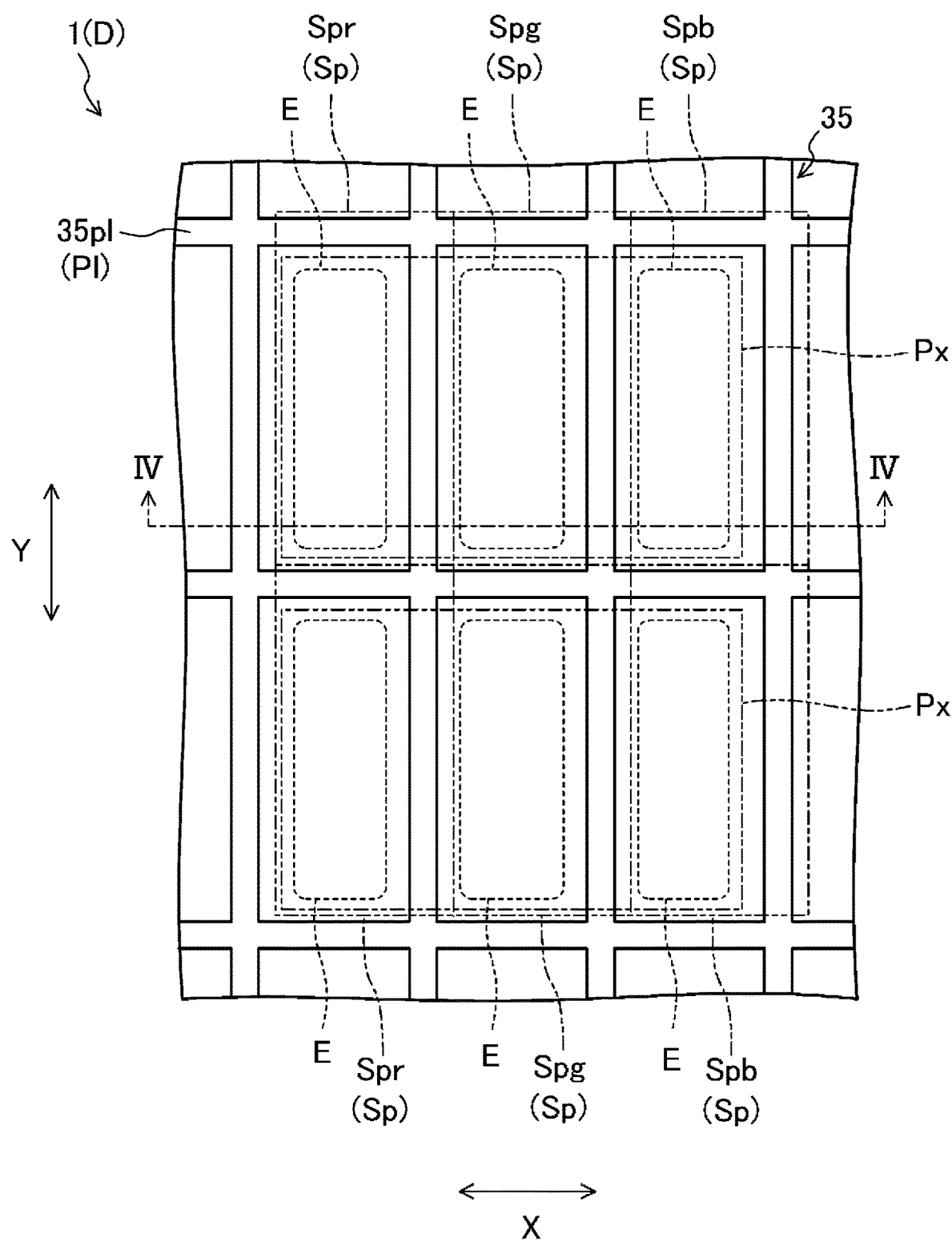
FIG. 4 is a plan view illustrating the pixels constituting the display region of the organic EL display device, and display wiring lines of a fourth conductive layer.
Figure 5:
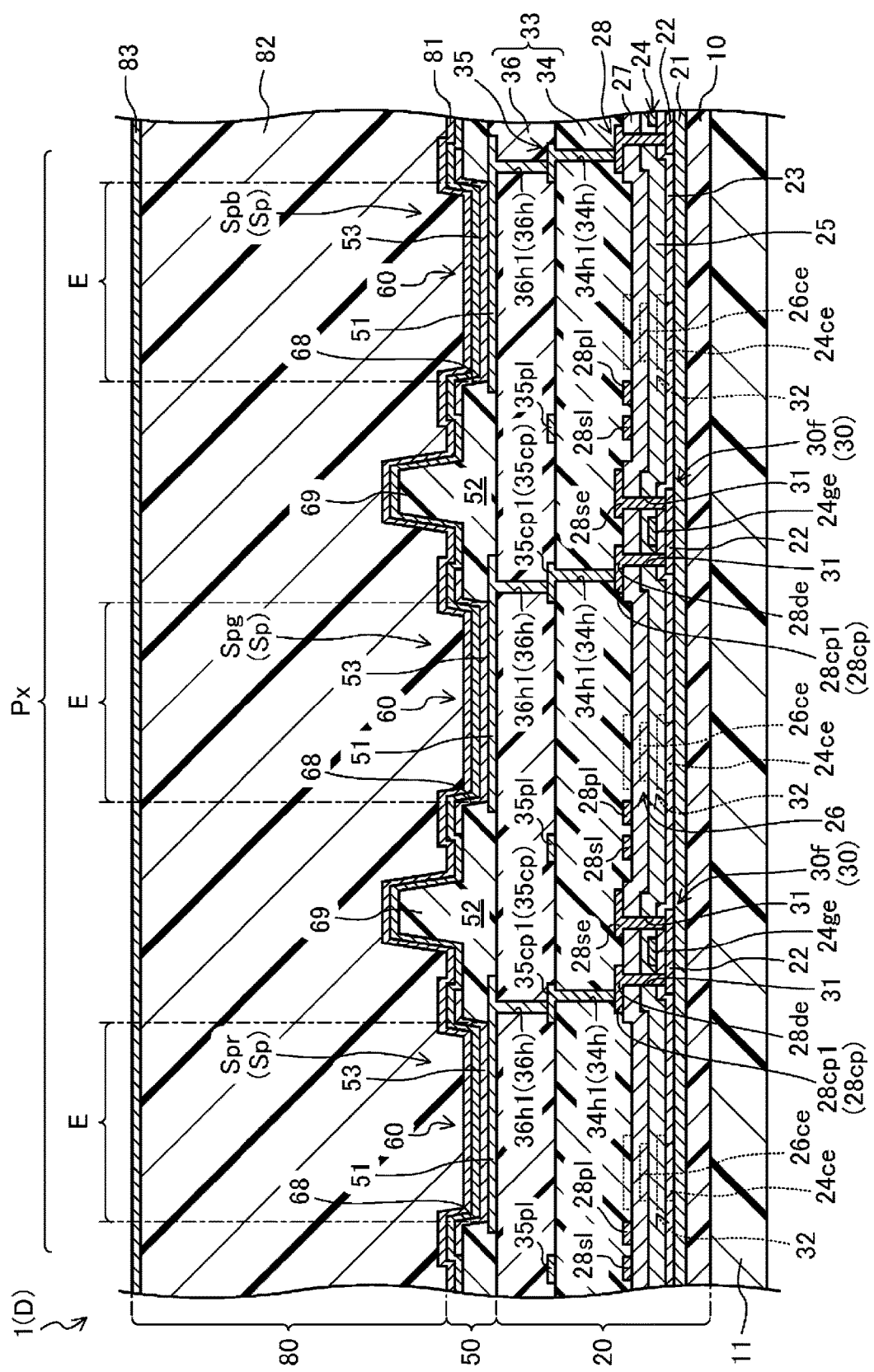
FIG. 5 is a cross-sectional view of the organic EL display device at a section along a line V-V in FIG. 3.

FIG. 1 to FIG. 5 illustrate an example of an organic EL display device 1 according to the technique of the disclosure. FIG. 1 is a plan view illustrating a schematic configuration of the organic EL display device 1 according to a first embodiment. FIG. 2 is a cross-sectional view of the organic EL display device 1 at a section along a line II-II in FIG. 1. FIG. 3 is a plan view illustrating pixels Px constituting a display region D of the organic EL display device 1 and display wiring lines of each of a first conductive layer 24, a second conductive layer 26, and a third conductive layer 28. FIG. 4 is a plan view illustrating the pixels Px constituting the display region D of the organic EL display device 1, and display wiring lines of a fourth conductive layer 35. FIG. 5 is a cross-sectional view of the organic EL display device 1 at a section along a line V-V in FIG. 3.

Configuration of Organic EL Display Device

As illustrated in FIG. 1 and FIG. 2, the organic EL display device 1 constitutes a display device, provided with an in-camera, that is combined with a camera 3 that captures an image of the front face side, of the display device, on which an image is displayed. The organic EL display device 1 includes the display region D that displays the image, and a frame region F provided in the periphery of the display region D. The camera 3 is disposed on the back face side of the display region D with respect to a resin substrate layer 10 of the organic EL display device 1, and is provided at a position overlapping with the display region D in a plan view.

The camera 3 is an electronic component that utilizes light transmitted through a light-emitting element layer 50, a TFT layer 20, and the resin substrate layer 10, which will be described below, from the front face side of the display region D in the organic EL display device 1. For example, the camera 3 includes a charge coupled device (CCD), a complementary metal oxide semiconductor (CMOS) image sensor, or the like. The camera 3 is installed inside a housing (not illustrated) that houses the organic EL display device 1.

The display region D is a rectangular region constituting a screen. Note that, in the present embodiment, although the display region D having the rectangular shape is illustrated as an example, the display region D may have a substantially rectangular shape such as a shape whose sides are arc-shaped, a shape whose corners are arc-shaped, a shape in which a part of a side has a notch, or the like. As illustrated in FIG. 3 and FIG. 4, the display region D includes a plurality of the pixels Px.

The plurality of pixel Px are disposed in a matrix shape. Each of the pixels Px is constituted by three subpixels Sp. The three subpixels Sp are a subpixel Spr including a light-emitting region E that emits red light, a subpixel Spg including the light-emitting region E that emits green light, and a subpixel Spb including the light-emitting region E that emits blue light. These three subpixels Spr, Spg, and Spb are arrayed in a stripe shape, for example.

As illustrated in FIG. 1, the display region D includes a first display region D1 and a second display region D2. The first display region D1 is a region that occupies a large portion of the display region D. The second display region D2 is located inside the first display region D1. The second display region D2 is a region including a portion of the display region D that transmits light to be utilized for image capture by the camera 3. The second display region D2 is provided in a rectangular island-shape on the upper side of the display region D, for example, and is surrounded by the first display region D1. The second display region D2 may have the substantially rectangular shape as described above, or may have another shape such as a circular shape or an elliptical shape.

The frame region F is a region having a rectangular frame shape and constituting a non-display portion other than the screen. A terminal portion T to be connected to an external circuit is provided in a portion constituting one side of the frame region F. A bending portion B that is bendable with a first direction X, which is the horizontal direction in FIG. 1, as the bending axis is provided between the display region D and the terminal portion T in the frame region F.

As illustrated in FIG. 2, the terminal portion T is disposed on the back face side of the organic EL display device 1 as a result of the frame region F being bent, for example, by 180° (into a U shape) at the bending portion B. The terminal portion T is connected to a wiring line substrate Cb such as a flexible printed circuit (FPC). As illustrated in FIG. 1, a plurality of lead-out wiring lines L1 drawn from the display region D to the terminal portion T are provided in the frame region F. The plurality of lead-out wiring lines L1 are connected to a display control circuit (not illustrated) via the wiring line substrate Cb at the terminal portion T.

In the frame region F, in a flattening film 33 to be described below, a trench G is provided so as to surround the display region D. The trench G extends in a substantially C-shape in a plan view, and is open on the terminal portion T side. The trench G penetrates the flattening film 33, and divides the flattening film 33 into an inner side and an outer side of the frame region F. The trench G plays a role of preventing infiltration of moisture or the like into the display region D. The trench G may be provided over the entire periphery of the display region D.

In the frame region F, a drive circuit Dc including a gate driver Gd and an emission driver Ed is monolithically provided in a portion constituting sides adjacent to the side at which the terminal portion T is provided (both left and right sides in FIG. 1). The gate driver Gd is disposed further to the display region D side than the trench G. The emission driver Ed is disposed further to the outer peripheral side of the frame region F than the trench G. The arrangement of the gate driver Gd and the emission driver Ed with respect to the trench G may be reversed.

The frame region F is provided with a first frame wiring line La (indicated by hatching with diagonal lines extending upward to the left in FIG. 1) and a second frame wiring line Lb (indicated by hatching with diagonal lines extending upward to the right in FIG. 1). The first frame wiring line La is provided in a frame shape further to the display region D side than the trench G and the drive circuit Dc. The first frame wiring line La extends to the terminal portion T through the open portion of the trench G in the frame region F. A high-level power supply voltage (ELVDD) is input to the first frame wiring line La via the wiring line substrate Cb at the terminal portion T. The second frame wiring line Lb is provided in a substantially C-shape further to the outer peripheral side of the frame region F than the trench G and the drive circuit Dc. Both end portions of the second frame wiring line Lb extend to the terminal portion T along the first frame wiring line La. A low-level power supply voltage (ELVSS) is input to the second frame wiring line Lb via the wiring line substrate Cb at the terminal portion T.

A first dam wall Wa and a second dam wall Wb are provided in the frame region F. The first dam wall Wa is provided in a frame shape on the outer side of the trench G. The second dam wall Wb is provided in a frame shape at the outer periphery of the first dam wall Wa. When applying an organic material that forms an organic sealing layer 82 constituting a sealing film 80 during a manufacturing process of the organic EL display device 1, the first dam wall Wa and the second dam wall Wb play a role of holding back an expansion of the organic material to the outer side of the frame region F. Although not illustrated, the first dam wall Wa and the second dam wall Wb are each constituted by a first wall layer and a second wall layer provided on the first wall layer, for example.

The organic EL display device 1 employs an active matrix driving method in which light emission from each of the subpixels Sp is controlled by a TFT 30 and an image is displayed by the action of the TFT 30. As illustrated in FIG. 2 and FIG. 5, the organic EL display device 1 includes the resin substrate layer 10, the TFT layer 20 provided on the resin substrate layer 10, the light-emitting element layer 50 provided on the TFT layer 20, and the sealing film 80 provided so as to cover the light-emitting element layer 50.

Resin Substrate Layer

The resin substrate layer 10 is an example of a substrate forming a base. The resin substrate layer 10 is formed, for example, of an organic material such as a polyimide resin, a polyamide resin, or an epoxy resin. The resin substrate layer has flexibility. The resin substrate layer 10 may be constituted by a layered film formed by an inorganic insulating layer made of an inorganic material such as silicon oxide, silicon nitride, silicon oxynitride, and a resin layer made of the above-described organic material. A back face protection film 11 is bonded to the back face of the resin substrate layer 10.

TFT Layer

The TFT layer 20 includes a base coat film 21, a semiconductor layer 22, a gate insulating film 23, the first conductive layer 24, a first interlayer insulating film 25, the second conductive layer 26, a second interlayer insulating film 27, the third conductive layer 28, the flattening film 33 and the first wall layer, and the fourth conductive layer 35, which are sequentially provided on the resin substrate layer 10.

First to Fourth Conductive Layers

The first conductive layer 24, the second conductive layer 26, the third conductive layer 28, and the fourth conductive layer 35 include various wiring lines and electrodes.

The first conductive layer 24 is provided on the gate insulating film 23. The first conductive layer 24 includes a plurality of gate wiring lines 24gl, a plurality of gate electrodes 24ge, a plurality of emission control wiring lines 24el, a plurality of first capacitance electrodes 24ce, and a plurality of first lead-out wiring lines. The gate wiring lines 24gl, the gate electrodes 24ge, the emission control wiring lines 24el, the first capacitance electrodes 24ce, and the first lead-out wiring lines are constituted by a single-layer film or a layered film of a metal layer of, for example, aluminum (Al), tungsten (W), molybdenum (Mo), tantalum (Ta), chromium (Cr), titanium (Ti), copper (Cu), or the like, and are each formed of the same material in the same layer.

The second conductive layer 26 is provided on the first interlayer insulating film 25. The second conductive layer 26 includes a plurality of initialization power source wiring lines 26il, a plurality of first power source wiring lines 26pl, and a plurality of second capacitance electrodes 26ce. The initialization power source wiring lines 26il, the first power source wiring lines 26pl, and the second capacitance electrodes 26ce are constituted by a single-layer film or a layered film of a metal layer of, for example, aluminum (Al), tungsten (W), molybdenum (Mo), tantalum (Ta), chromium (Cr), titanium (Ti), copper (Cu), or the like, and are each formed of the same material in the same layer.

The third conductive layer 28 is provided on the second interlayer insulating film 27. The third conductive layer 28 includes a plurality of source wiring lines 28sl, a plurality of source electrodes 28se, a plurality of drain electrodes 28de, a plurality of connecting conductive portions 28cp, a plurality of second power source wiring lines 28pl, a plurality of second lead-out wiring lines, the first frame wiring line La, and the second frame wiring line Lb. The source wiring lines 28sl, the source electrodes 28se, the drain electrodes 28de, the second power source wiring lines 28pl, the second lead-out wiring lines, the first frame wiring line La, and the second frame wiring line Lb are constituted by a single-layer film or a layered film of a metal layer of, for example, aluminum (Al), tungsten (W), molybdenum (Mo), tantalum (Ta), chromium (Cr), titanium (Ti), copper (Cu), or the like, and are each formed of the same material in the same layer.

The fourth conductive layer 35 is provided on a lower layer flattening film 34 constituting the flattening film 33. The fourth conductive layer 35 includes a third power source wiring line 35pl and a plurality of relay conductive portions 35cp. The third power source wiring line 35pl and the plurality of relay conductive portions 35cp are constituted by a single-layer film or a layered film of a metal layer of, for example, aluminum (Al), tungsten (W), molybdenum (Mo), tantalum (Ta), chromium (Cr), titanium (Ti), copper (Cu), or the like, and are formed of the same material in the same layer.

The wiring lines and the electrodes of the third conductive layer 28 and the wiring lines and the electrodes of the fourth conductive layer 35 preferably have a low electrical resistance in order to allow a large amount of the current to flow therethrough and to transmit data signals. Because of this, as the wiring lines and the electrodes of the third conductive layer 38 and the wiring lines and the electrodes of the fourth conductive layer 35, for example, a layered film of a titanium layer, an aluminum layer, and a titanium layer, a layered film of a titanium layer and an aluminum layer, a layered film of a copper layer and a titanium layer, or a layered film obtained by replacing the titanium layer with a molybdenum layer or a tungsten layer in the above-described layered film is suitably used.

Further, the wiring lines and the electrodes of the third conductive layer 28 and the wiring lines and the electrodes of the fourth conductive layer 35 are each thicker than the wiring lines and the electrodes of the first conductive layer 24 and the wiring lines and the electrodes of the second conductive layer 26. Thus, light is less likely to be transmitted through the wiring lines and the electrodes of the third conductive layer 28 and the wiring lines and the electrodes of the fourth conductive layer 35 than through the wiring lines and the electrodes of the first conductive layer 24 and the wiring lines and the electrodes of the second conductive layer 26, and the wiring lines and the electrodes of the third conductive layer 28 and the wiring lines and the electrodes of the fourth conductive layer 35 prevent the light from being transmitted toward the back face side, at which the camera 3 is disposed, from the front face side of the display region D. The thickness of the wiring lines and the electrodes of the first conductive layer 24 is approximately from 100 nm to 300 nm. The thickness of the wiring lines and the electrodes of the second conductive layer 26 is approximately from 100 nm to 300 nm. The thickness of the wiring lines and the electrodes of the third conductive layer 28 is approximately from 400 nm to 800 nm. The thickness of the wiring lines and the electrodes of the fourth conductive layer 35 is approximately from 400 nm to 800 nm.

Various Wiring Lines and Conductive Portions

As illustrated in FIG. 3, the plurality of gate wiring lines 24gl are provided in the display region D and extend in parallel to each other in a first direction X. The gate wiring line 24gl is a display wiring line that transmits a gate signal and is provided for each row of the subpixels Sp. Each of the gate wiring lines 24gl is connected to the gate driver Gd, selected at a predetermined timing, and brought into an active state.

The plurality of emission control wiring lines 24el are provided in the display region D and extend in parallel to each other in the first direction X. The emission control wiring line 24el is a display wiring line that transmits an emission control signal and is provided for each row of the subpixels Sp. Each of the emission control wiring lines 24el is connected to the emission driver Ed, sequentially selected at a predetermined timing, and brought into an inactive state.

The plurality of first lead-out wiring lines are provided in the frame region F and extend in parallel to each other in a second direction Y, which is the vertical direction in FIG. 1 orthogonal to the first direction X. Each of the first lead-out wiring lines is a connection wiring line that connects the display wiring line, such as the source wiring line 28sl, to the terminal portion T, and constitutes a portion of the lead-out wiring line L1.

The plurality of initialization power source wiring lines 26il are provided in the display region D and extend in parallel to each other in the first direction X. The initialization power source wiring line 26il is a display wiring line that imparts an initialization potential and is provided for each row of the subpixels Sp.

The plurality of first power source wiring lines 26pl are provided in the display region D and extend in parallel to each other in the first direction X. The first power source wiring line 26pl is a display wiring line that imparts a predetermined high-level potential and is provided for each row of the subpixels Sp. Each of the first power source wiring lines 26pl is connected to the first frame wiring line La via a contact hole formed in the second interlayer insulating film 27.

The plurality of source wiring lines 28sl are provided in the display region D and extend in parallel to each other in the second direction Y. The source wiring line 28sl is a display wiring line that transmits a source signal and is provided for each column of the subpixels Sp. Each of the source wiring lines 28sl is connected to the lead-out wiring line L1, and is connected to the display control circuit via the lead-out wiring line L1 and the terminal portion T.

As illustrated in FIG. 5, the plurality of connecting conductive portions 28cp are provided in the display region D. The connecting conductive portion 28cp is formed in an island shape for each of the subpixels Sp, and is connected to the drain electrode 28de of a sixth TFT 30f to be described below. The relay conductive portion 35cp is connected to the connecting conductive portion 28cp via a lower layer contact hole 34h formed in the lower layer flattening film 34. The connecting conductive portion 28cp connects the drain electrode 28de of the sixth TFT 30f to the relay conductive portion 35cp.

As illustrated in FIG. 3, the plurality of second power source wiring lines 28pl are provided in the display region D and extend in parallel to each other in the second direction Y. The second power source wiring line 28pl is a display wiring line that imparts a predetermined high-level potential and is provided for each column of the subpixels Sp. Each of the second power source wiring lines 28pl is connected to the first frame wiring line La, and intersects with each of the first power source wiring lines 26pl. Each of the second power source wiring lines 28pl is connected to the first power source wiring line 26pl at an intersection therebetween, via a contact hole formed in the second interlayer insulating film 27. The plurality of second power source wiring lines 28pl constitute a high-level power source wiring line Pl together with the plurality of first power source wiring lines 26pl.

The plurality of second lead-out wiring lines are provided in the frame region F, and extend in parallel to each other in the second direction Y. Each of the second lead-out wiring lines is connected to the first lead-out wiring line via a contact hole formed in the first interlayer insulating film 25 and the second interlayer insulating film 27. Each of the second lead-out wiring lines is a connection wiring line that connects the display wiring line such as the source wiring line 28sl to the terminal portion T, and constitutes the lead-out wiring line L1 together with the first lead-out wiring line.

As illustrated in FIG. 4, the third power source wiring lines 35pl are provided in the display region D, and extend in a lattice pattern so as to extend in parallel to each other in both the first direction X and the second direction Y. The third power source wiring line 35pl is a display wiring line that imparts a predetermined high-level potential, constitutes a space for each of the subpixels Sp between rows and columns of the lattice pattern, and extends between the light-emitting regions E of the adjacent subpixels Sp. The third power source wiring line 35*pl* is connected to both the first frame wiring line La and the second power source wiring line 28*pl* via a contact hole formed in the lower layer flattening film 34. The third power source wiring line 35*pl* constitutes the high-level power source wiring line Pl together with the plurality of second power source wiring lines 28*pl*.

The plurality of relay conductive portions 35*cp* are provided in the display region D. The relay conductive portion 35*cp* is formed in an island shape for each of the subpixels Sp, and is connected to the connecting conductive portion 28*cp* via the lower layer contact hole 34*h* formed in the lower layer flattening film 34. A first electrode 51 is connected to the relay conductive portion 35*cp* via an upper layer contact hole 36*h* formed in an upper layer flattening film 36. The relay conductive portion 35*cp* connects the connecting conductive portion 28*cp* to the first electrode 51.

Various Electrodes

The plurality of gate electrodes 24*ge*, source electrodes 28*se*, and drain electrodes 28*de* are provided for each of the subpixels Sp, and constitute the TFT 30 together with the gate insulating film 23, the first interlayer insulating film 25, and the second interlayer insulating film 27. At least one each of the first capacitance electrodes 24*ce* and the second capacitance electrodes 26*ce* are provided for each of the subpixels Sp, and constitute a capacitor 32 together with the first interlayer insulating film 25.

TFT

A plurality of the TFTs 30 are provided for each of the subpixels Sp. In other words, the TFT layer 20 includes the plurality of TFTs 30. Each of the plurality of TFTs 30 is a top-gate type TFT. Each of the TFTs 30 is constituted by the semiconductor layer 22, the gate insulating film 23, the gate electrode 24*ge*, the first interlayer insulating film 25 and the second interlayer insulating film 27, and the source electrode 28*se* and the drain electrode 28*de*.

The semiconductor layer 22 is provided in an island shape. The semiconductor layer 22 is formed of a low temperature polycrystalline silicon (LTPS), an oxide semiconductor such as an indium gallium zinc oxide (In—Ga—Zn—O based), or the like, for example.

The gate insulating film 23 is provided so as to cover the semiconductor layer 22. The gate insulating film 23 is formed of a single-layer film or a layered film formed by an inorganic insulating layer of, for example, silicon oxide, silicon nitride, silicon oxynitride, or the like. The gate electrode 24*ge* is provided at a position overlapping with a part (channel region) of the semiconductor layer 22 via the gate insulating film 23.

The first interlayer insulating film 25 is provided so as to cover the gate wiring lines 24*gl*, the gate electrodes 24*ge*, the emission control wiring lines 24*el*, and the first capacitance electrodes 24*ce*. The second interlayer insulating film 27 is provided on the first interlayer insulating film 25 so as to cover the initialization power source wiring lines 26*il*, the first power source wiring lines 26*pl*, and the second capacitance electrodes 26*ce*. Each of the first interlayer insulating film 25 and the second interlayer insulating film 27 is formed of a single-layer film or a layered film formed by an inorganic insulating layer of, for example, silicon oxide, silicon nitride, silicon oxynitride, or the like.

The source electrode 28*se* and the drain electrode 28*de* are separated from each other. The source electrode 28*se* and the drain electrode 28*de* are connected to different portions (source region and drain region) of the semiconductor layer 22, at positions on either side of a region, of the semiconductor layer 22, overlapping with the gate electrode 24*ge*, via a contact hole 31 formed in the gate insulating film 23, the first interlayer insulating film 25, and the second interlayer insulating film 27.

Capacitor

At least one of the capacitors 32 is provided for each of the subpixels Sp. In other words, the TFT layer 20 includes a plurality of the capacitors 32. Each of the plurality of capacitors 32 is constituted by the first capacitance electrode 24*ce*, the first interlayer insulating film 25, and the second capacitance electrode 26*ce*.

The first capacitance electrode 24*ce* is connected to three of the TFTs 30 (a first TFT 30*a*, a second TFT 30*b*, and a fourth TFT 30*d*), of the plurality of TFTs 30 provided for each of the subpixels Sp. The second capacitance electrode 26*ce* is provided at a position overlapping with the first capacitance electrode 24*ce* via the first interlayer insulating film 25. The second capacitance electrode 26*ce* is connected to the high-level power source wiring line Pl.

Figure 6:
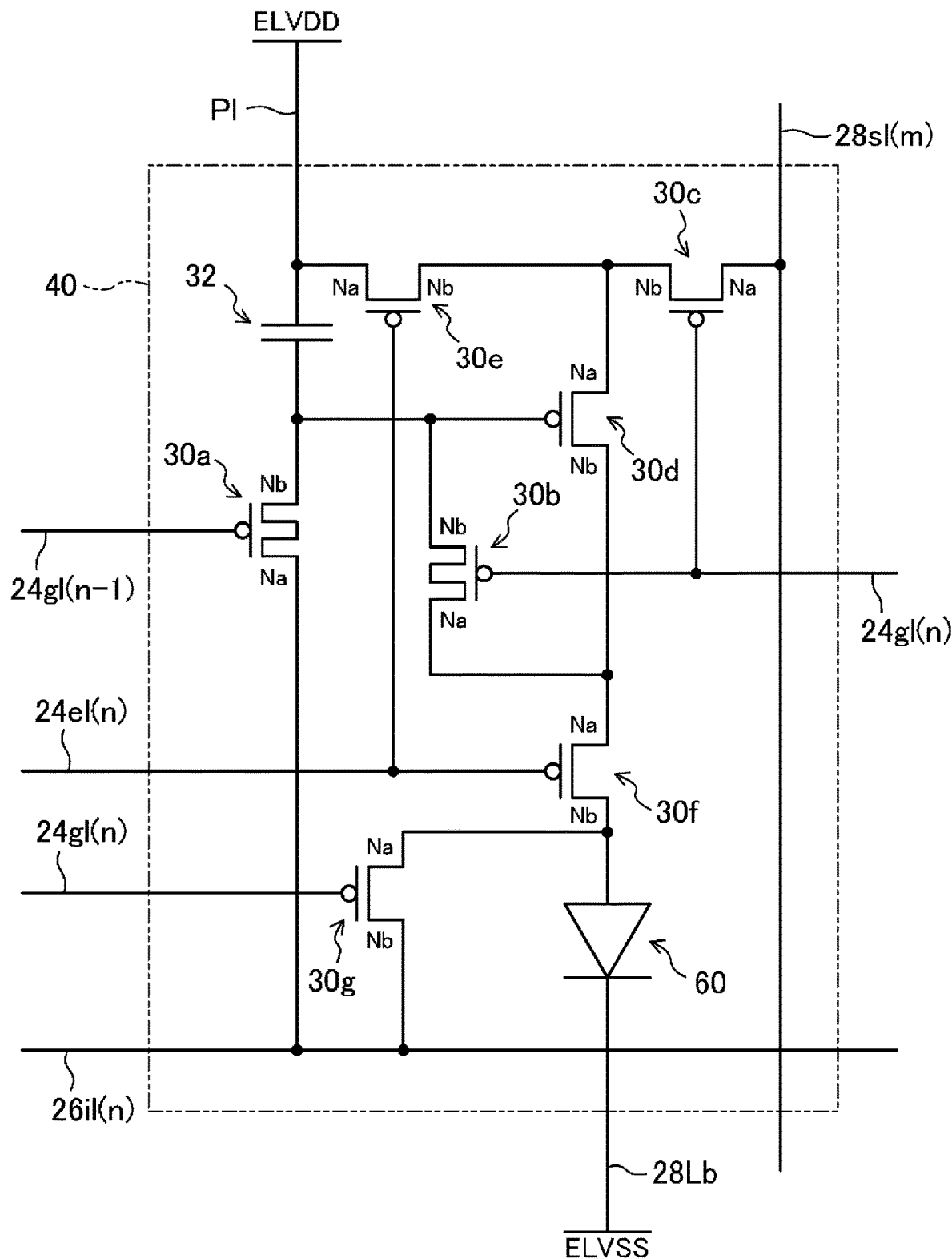
FIG. 6 is an equivalent circuit diagram illustrating a pixel circuit of the organic EL display device according to the first embodiment.

FIG. 6 is an equivalent circuit diagram illustrating a pixel circuit 40.

The plurality of TFTs 30 and the capacitor 32 provided for each of the subpixels Sp constitute the pixel circuit 40, as illustrated in FIG. 6. The pixel circuit 40 controls light emission in the light-emitting region E of the corresponding subpixel Sp based on the gate signal supplied from the gate wiring line 24*gl*, the emission signal supplied from the emission control wiring line 24*el*, the source signal supplied from the source wiring line 28*sl*, the initialization potential supplied from the initialization power source wiring line 26*il*, and the high-level potential supplied from the high-level power source wiring line Pl.

The pixel circuit 40 illustrated in FIG. 6 is the pixel circuit 40 of the subpixel Sp in the m-th row and n-th column (m and n are positive integers). In FIG. 6, the source wiring line 28*sl*, to which (m) is added to the reference numeral thereof, is the source wiring line 28*sl* corresponding to the subpixels Sp in the m-th row. The gate wiring line 24*gl* and the emission control wiring line 24*el*, to which (n) is added to the reference numerals thereof, are the gate wiring line 24*gl* and the emission control wiring line 24*el* corresponding to the subpixels Sp in the n-th column. Further, the gate wiring line 24*gl*, to which (n−1) is added to the reference numeral thereof, is the gate wiring line 24*gl* that is scanned immediately before the gate wiring line 24*gl* in the n-th row.

The plurality of TFTs 30 constituting the pixel circuit 40 include the first TFT 30*a*, the second TFT 30*b*, a third TFT 30*c*, the fourth TFT 30*d*, a fifth TFT 30*e*, the sixth TFT 30*f*, and a seventh TFT 30*g*. These first to seventh TFTs 30*a*, 30*b*, 30*c*, 30*d*, 30*e*, 30*f*, and 30*g* are each, for example, a p-channel type TFT. In the first to seventh TFTs 30*a*, 30*b*, 30*c*, 30*d*, 30*e*, 30*f*, and 30*g*, the gate electrode 24*ge* corresponds to a control terminal, one electrode of the source electrode 28*se* and the drain electrode 28*de* corresponds to a first conduction terminal Na, and the other electrode corresponds to a second conduction terminal Nb.

The first TFT 30*a* is a first initialization TFT provided between the gate wiring line 24*gl*(n−1), the initialization power source wiring line 26*il*, and the capacitor 32. A control terminal of the first TFT 30*a* is connected to the gate wiring line 24*gl*(n−1). The first conduction terminal Na of the first TFT 30*a* is connected to the initialization power source wiring line 26*i*1. The second conduction terminal Nb of the first TFT 30*a* is connected to the first capacitance electrode 24*ce* of the capacitor 32. This first TFT 30*a* initializes a voltage applied to a control terminal of the fourth TFT 30*d* by applying a voltage of the initialization power source wiring line 26*il* to the capacitor 32 in response to the selection of the gate wiring line 24*gl*(n−1).

The second TFT 30*b* is a threshold voltage compensation TFT provided between the gate wiring line 24*gl*(*n*) and the fourth TFT 30*d*. A control terminal of the second TFT 30*b* is connected to the gate wiring line 24*gl*. The first conduction terminal Na of the second TFT 30*b* is connected to the second conduction terminal Nb of the fourth TFT 30*d*. The second conduction terminal Nb of the second TFT 30*b* is connected to the control terminal of the fourth TFT 30*d*. This second TFT 30*b* causes the fourth TFT 30*d* to be in a diode-connected state in response to the selection of the gate wiring line 24*gl*(*n*), and compensates for a threshold voltage of the fourth TFT 30*d*.

The third TFT 30*c* is a writing TFT provided between the gate wiring line 24*gl*(*n*), the source wiring line 28*sl*(*m*), and the fourth TFT 30*d*. A control terminal of the third TFT 30*c* is connected to the gate wiring line 24*gl*(*n*). The first conduction terminal Na of the third TFT 30*c* is connected to the source wiring line 28*sl*(*m*). The second conduction terminal Nb of the third TFT 30*c* is connected to the first conduction terminal Na of the fourth TFT 30*d*. This third TFT 30*c* applies a voltage of the source wiring line 28*sl*(*m*) to the first conduction terminal Na of the fourth TFT 30*d* in response to the selection of the gate wiring line 24*gl*.

The fourth TFT 30*d* is a driving TFT provided between the first TFT 30*a*, the second TFT 30*b*, the capacitor 32, the third TFT 30*c*, the fifth TFT 30*e*, and the sixth TFT 30*f*. The control terminal of the fourth TFT 30*d* is connected to the second conduction terminal Nb of the second TFT 30*b* and the second conduction terminal Nb of the first TFT 30*a*. The first conduction terminal Na of the fourth TFT 30*d* is connected to the second conduction terminal Nb of the third TFT 30*c* and the second conduction terminal Nb of the fifth TFT 30*e*. The second conduction terminal Nb of the fourth TFT 30*d* is connected to the first conduction terminal Na of the second TFT 30*b* and the first conduction terminal Na of the sixth TFT 30*f*. This fourth TFT 30*d* applies a drive current corresponding to a voltage applied between the control terminal of its own element and the first conduction terminal Na, to the first conduction terminal Na of the sixth TFT 30*f*.

The fifth TFT 30*e* is a power supply TFT provided between the emission control wiring line 24*el*(*n*), the high-level power source wiring line Pl, and the fourth TFT 30*d*. A control terminal of the fifth TFT 30*e* is connected to the emission control wiring line 24*el*(*n*). The first conduction terminal Na of the fifth TFT 30*e* is connected to the high-level power source wiring line Pl. The second conduction terminal Nb of the fifth TFT 30*e* is connected to the first conduction terminal Na of the fourth TFT 30*d*. This fifth TFT 30*e* applies a potential of the high-level power source wiring line Pl to the first conduction terminal Na of the fourth TFT 30*d* in response to the selection of the emission control wiring line 24*el*.

The sixth TFT 30*f* is a light emission control TFT provided between the emission control wiring line 24*el*(*n*), the second TFT 30*b*, the fourth TFT 30*d*, and the organic EL element 60. A control terminal of the sixth TFT 30*f* is connected to the emission control wiring line 24*el*(*n*). The first conduction terminal Na of the sixth TFT 30*f* is connected to the second conduction terminal Nb of the fourth TFT 30*d*. The second conduction terminal Nb of the sixth TFT 30*f* is connected to the first electrode 51 of the organic EL element 60. This sixth TFT 30*f* applies a drive current to the organic EL element 60 in response to a selection of the emission control wiring line 24*el*(*n*).

The seventh TFT 30*g* is a second initialization TFT provided between the gate wiring line 24*gl*(*n*), the initialization power source wiring line 26*il*, and the organic EL element 60. A control terminal of the seventh TFT 30*g* is connected to the gate wiring line 24*gl*(*n*). The second conduction terminal Nb of the seventh TFT 30*g* is connected to the initialization power source wiring line 26*i*1. The first conduction terminal Na of the seventh TFT 30*g* is connected to the first electrode 51 of the organic EL element 60. This seventh TFT 30*g* resets a charge accumulated in the first electrode 51 of the organic EL element 60 in response to the selection of the gate wiring line 24*gl*.

The capacitor 32 is a data holding element provided between the high-level power source wiring line Pl, the first TFT 30*a*, and the fourth TFT 30*d*. The first capacitance electrode 24*ce* of the capacitor 32 is connected to the control terminal of the fourth TFT 30*d*, the second conduction terminal Nb of the first TFT 30*a*, and the second conduction terminal Nb of the second TFT 30*b*. The second capacitance electrode 26*ce* of the capacitor 32 is connected to the high-level power source wiring line Pl. The capacitor 32 is charged at a voltage of the source wiring line 28*sl* when the gate wiring line 24*gl* is in a selected state. The capacitor 32 holds the voltage written by the charging to maintain the voltage applied to the control terminal of the fourth TFT 30*d* when the gate wiring line 24*gl* is in a non-selected state.

Flattening Film

The flattening film 33 illustrated in FIG. 5 flattens the surface of the TFT layer 20 so as to reduce a level difference generated by the surface shape of the first TFT 30*a*, the second TFT 30*b*, the third TFT 30*c*, the fourth TFT 30*d*, the fifth TFT 30*e*, the sixth TFT 30*f*, and the seventh TFT 30*g*. The flattening film 33 includes the lower layer flattening film 34, and the upper layer flattening film 36 provided on the lower layer flattening film 34.

In the display region D, the lower layer flattening film 34 covers the third conductive layer 28 (source wiring line 28*sl*, second power source wiring line 28*pl*, source electrode 28*se*, and drain electrode 28*de*) except for a part of the drain electrode 28*de* of the sixth TFT 30*f*. The lower layer flattening film 34 is formed of an organic material such as a polyimide resin, for example. In the lower layer flattening film 34, the lower layer contact hole 34*h*, which causes the drain electrode 28*de* of the sixth TFT 30*f* to be exposed from the bottom, is formed for each of the subpixels Sp.

In the display region D, the upper layer flattening film 36 covers the fourth conductive layer (third power source wiring line 35*pl* and relay conductive portion 35*cp*) except for a part of the relay conductive portion 35*cp*. The upper layer flattening film 36 is formed of an acrylic resin such as a polymethyl methacrylate resin (PMMA), for example. The acrylic resin is preferably used as the material of the upper layer flattening film 36 from the perspective of increasing the transmittance of light. The upper layer flattening film 36 may be formed of an organic material such as a polyimide resin, for example. In the upper layer flattening film 36, the upper layer contact hole 36*h*, which causes the relay conductive portion 35*cp* to be exposed from the bottom, is formed for each of the subpixels Sp.

Two of the first wall layers are provided at the outer periphery of the flattening film 33 in the frame region F. Each of the first wall layers is formed in a rectangular frame shape extending along the entire periphery of the flattening film 33. These two first wall layers have geometrically similar shapes and are arranged so as to be spaced apart from each other in the width direction of the frame region F. Each of the first wall layers is formed by the same material in the same layer as one or both of the lower layer flattening film 34 and the upper layer flattening film 36.

Light-Emitting Element Layer

Figure 7:
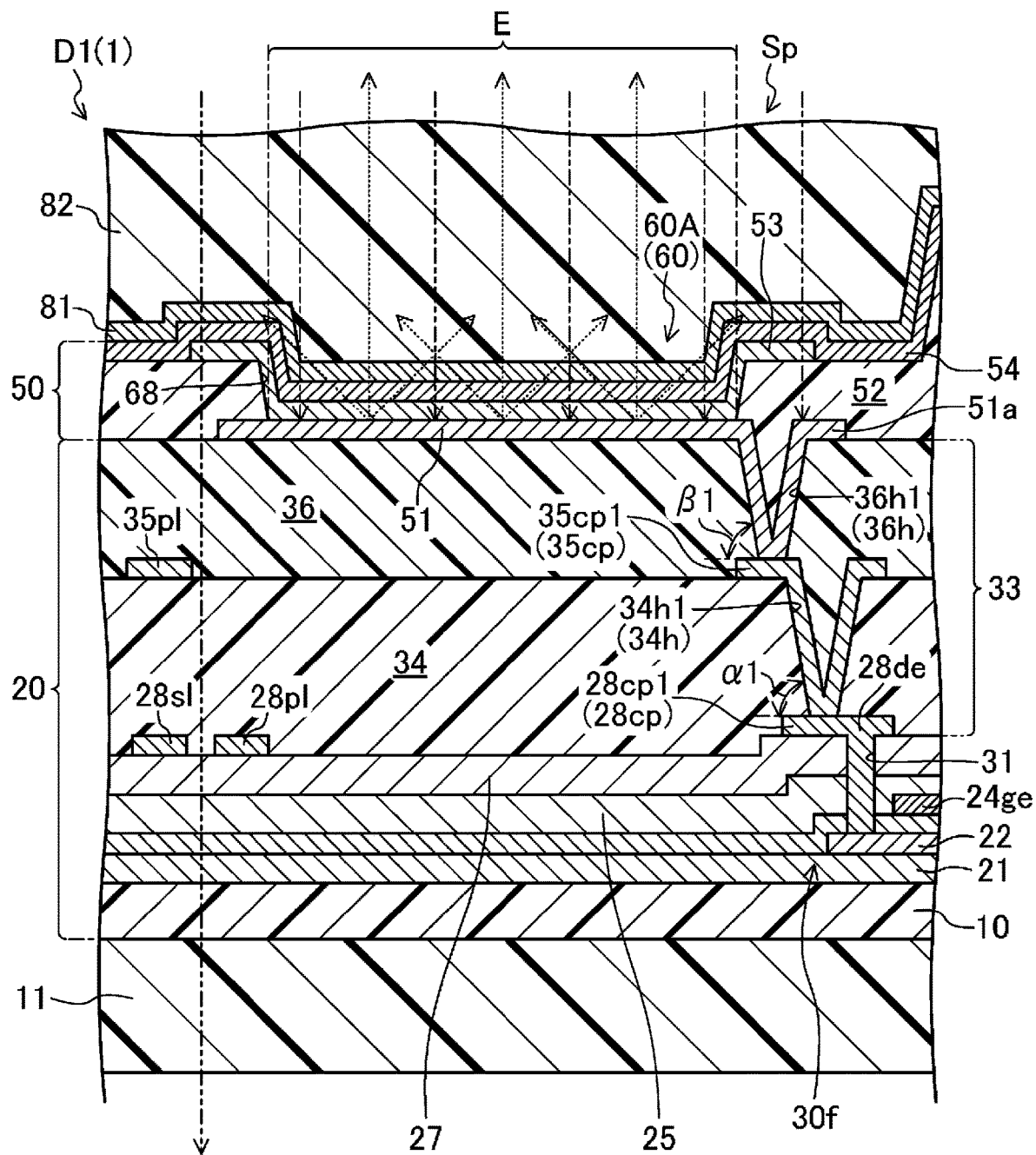
FIG. 7 is a cross-sectional view illustrating main portions in a first display region of the organic EL display device according to the first embodiment.
Figure 8:
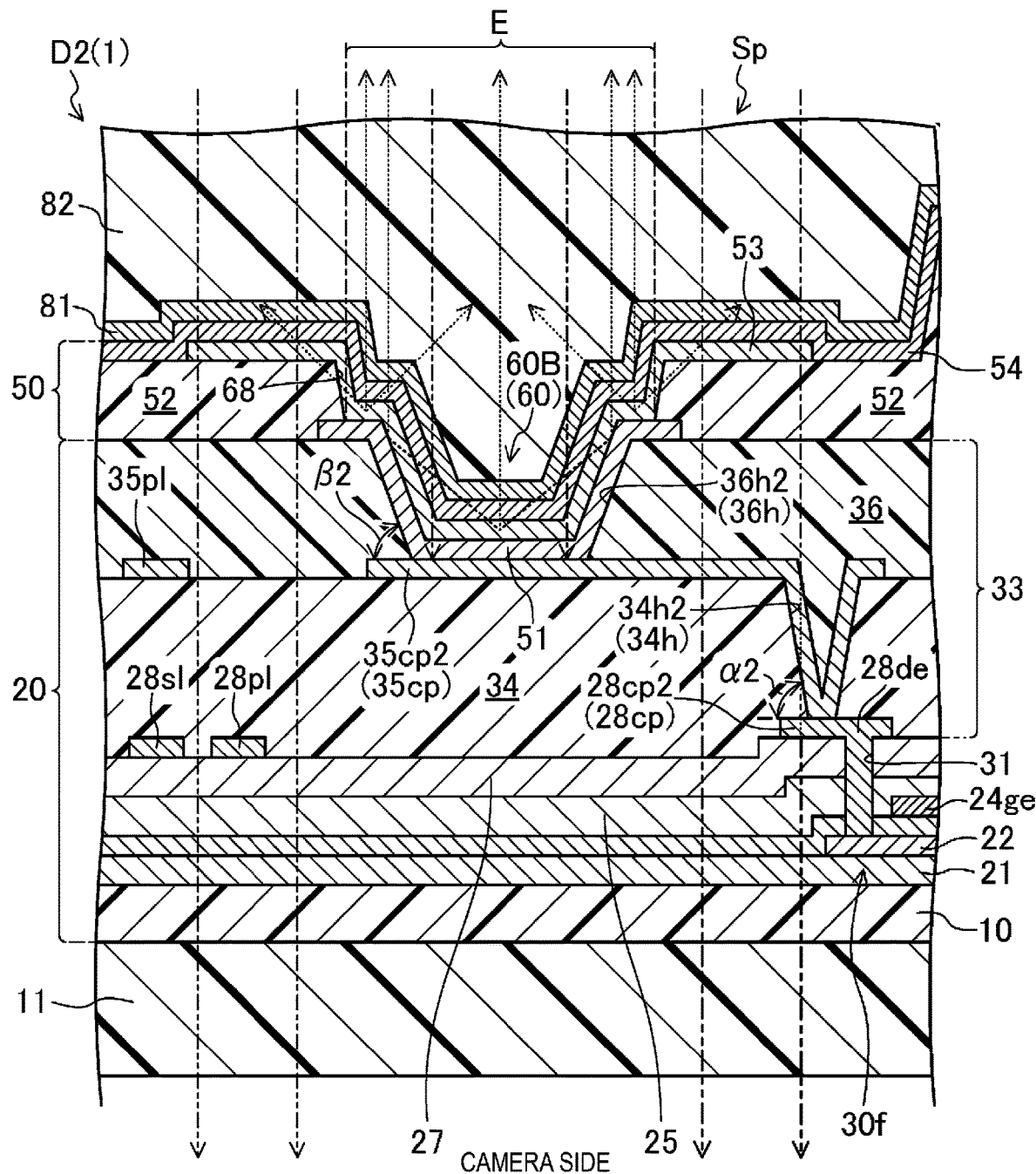
FIG. 8 is a cross-sectional view illustrating main portions in a second display region of the organic EL display device according to the first embodiment.
Figure 9:
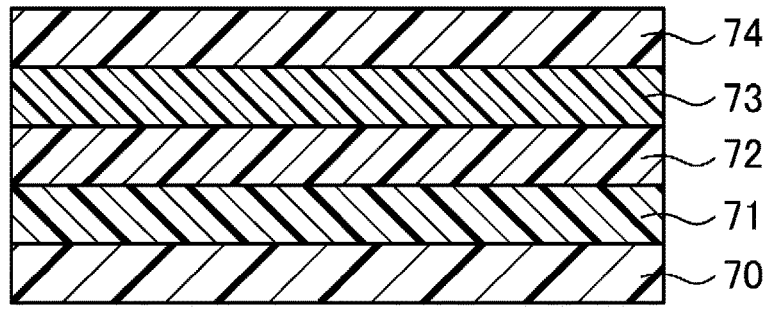
FIG. 9 is a cross-sectional view illustrating a layered structure of an organic EL layer constituting the organic EL display device according to the first embodiment.
Figure 10:
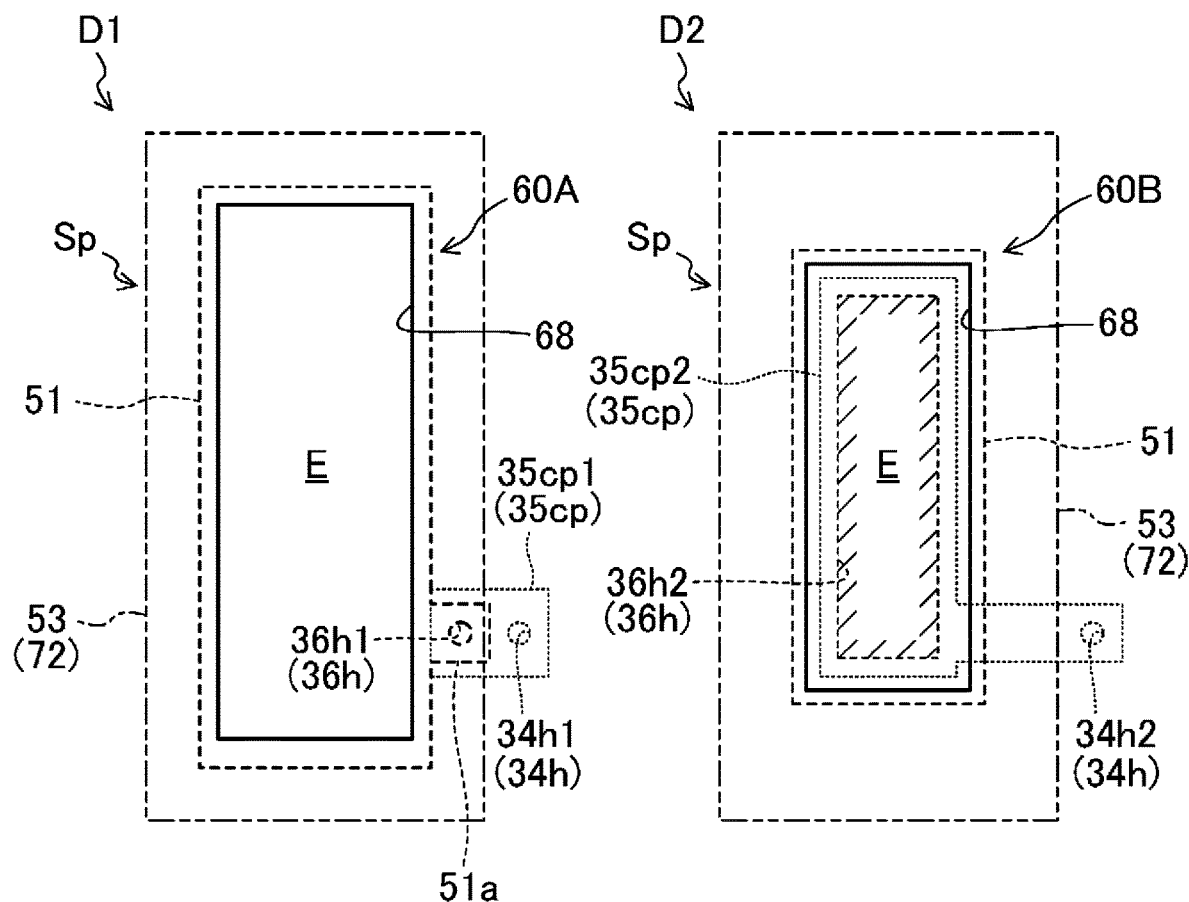
FIG. 10 is a plan view illustrating a configuration of each of light-emitting regions in the first display region and the second display region of the organic EL display device according to the first embodiment, and of the periphery thereof.

FIG. 7 is a cross-sectional view illustrating main portions of the organic EL display device 1 in the first display region D1. FIG. 8 is a cross-sectional view illustrating main portions of the organic EL display device 1 in the second display region D2. FIG. 9 is a cross-sectional view illustrating a layered structure of an organic EL layer 53 constituting the organic EL display device 1. FIG. 10 is a plan view illustrating a configuration of each of the light-emitting regions E in the first display region D1 and the second display region D2, and of the periphery thereof.

As illustrated in FIG. 5, FIG. 7, and FIG. 8, the light-emitting element layer 50 includes the first electrode 51, an edge cover 52 and the second wall layer, the organic EL layer 53, and a second electrode 54, which are provided in that order on the flattening film 33 (upper layer flattening film 36).

The first electrode 51, the organic EL layer 53, and the second electrode 54 constitute the organic EL element 60. The organic EL element 60 is an example of a light-emitting element. The organic EL element 60 is provided for each of the subpixels Sp. In other words, the light-emitting element layer 50 includes a plurality of the organic EL elements 60. Each of the plurality of organic EL elements 60 is a top-emitting type organic EL element.

First Electrode

The first electrode 51 is provided for each of the subpixels Sp. The first electrode 51 is connected to the drain electrode 28de of the sixth TFT 30f in the corresponding subpixel Sp, via the relay conductive portion 35cp. This first electrode 51 is formed differently in the first display region D1 and the second display region D2 so as to have different areas in each of the regions. The first electrode 51 functions as an anode electrode that injects positive holes (holes) into the organic EL layer 53. The first electrode 51 has light reflectivity to reflect light.

Examples of the material of the first electrode 51 include a metal material such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn).

Further, the material of the first electrode 51 may be an alloy such as astatine (At) and astatine oxide (AtO2), for example. Furthermore, the material of the first electrode 51 may be a conductive oxide such as tin oxide (SnO), zinc oxide (ZnO), indium tin oxide (ITO), and indium zinc oxide (IZO), for example. The first electrode 51 is preferably formed of a material having a large work function to improve the efficiency of hole injection into the organic EL layer 53. The first electrode 51 may be formed by layering a plurality of layers formed of any of the materials described above.

Edge Cover

The edge cover 52 is common to the first display region D1 and the second display region D2. As illustrated in FIG. 5, the edge cover 52 partitions the first electrodes 51 of the adjacent subpixels Sp. The edge cover 52 is formed in a lattice pattern as a whole, and covers a peripheral portion of each of the first electrodes 51. Examples of the material of the edge cover 52 include an organic material such as a polyimide resin, an acrylic resin, a polysiloxane resin, and a novolak resin. A part of the surface of the edge cover 52 protrudes upward to form a photo spacer 69.

An opening 68 that exposes the first electrode 51 is formed in the edge cover 52 for each of the organic EL elements 60. The organic EL element 60 emits light in a region corresponding to the opening 68 of the edge cover 52. Of the subpixel Sp, a region corresponding to the opening 68 of the edge cover 52 constitutes the light-emitting region E. At least the sixth TFT 30f of the first to seventh TFTs 30a, 30b, 30c, 30d, 30e, 30f, and 30g is located at a position overlapping with the edge cover 52.

Second Wall Layer

The second wall layer is layered on each of the two first wall layers. In other words, each of the second wall layers is formed in a rectangular frame shape extending along the entire periphery of the flattening film 33. These two second wall layers have geometrically similar shapes, and are arranged so as to be spaced apart from each other in the width direction of the frame region F. Each of the second wall layers is formed by the same material in the same layer as the edge cover 52.

Organic EL Layer

The organic EL layer 53 has the same configuration in the first display region D1 and in the second display region D2. The organic EL layer 53 is an example of a light-emitting function layer. As illustrated in FIG. 7 and FIG. 8, the organic EL layer 53 is provided on the first electrode 51 inside each of the openings 68 of the edge cover 52. As illustrated in FIG. 9, the organic EL layer 53 includes a hole injection layer 70, a hole transport layer 71, a light-emitting layer 72, an electron transport layer 73, and an electron injection layer 74, which are provided in that order on the first electrode 51. Some layers of the hole injection layer 70, the hole transport layer 71, the electron transport layer 73, and the electron injection layer 74 may be provided commonly for the plurality of subpixels Sp as a continuous layer.

The hole injection layer 70 is also referred to as an anode electrode buffer layer. The hole injection layer 70 reduces the energy level difference between the first electrode 51 and the organic EL layer 53, and improves the efficiency of hole injection into the organic EL layer 53 from the first electrode 51. Examples of the material of the hole injection layer 70 include a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, and a stilbene derivative.

The hole transport layer 71 functions to migrate positive holes to the light-emitting layer 72 efficiently. Examples of the material of the hole transport layer 71 include a porphyrin derivative, an aromatic tertiary amine compound, a styrylamine derivative, polyvinylcarbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, and zinc selenide.

When a voltage is applied by the first electrode 51 and the second electrode 54, the light-emitting layer 72 recombines the positive holes injected from the first electrode 51 with the electrons injected from the second electrode 54 and emits light. The light-emitting layer 72 is formed of a different material depending on a luminescent color (red, green, or blue) of the organic EL element 60 in the individual subpixel Sp, for example.

Examples of the material of the light-emitting layer 72 include a metal oxinoid compound (8-hydroxyquinoline metal complexes), a naphthalene derivative, an anthracene derivative, a diphenylethylene derivative, a vinyl acetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzothiazole derivative, a styryl derivative, a styrylamine derivative, a bisstyrylbenzene derivative, a trisstyrylbenzene derivative, a perylene derivative, a perinone derivative, an aminopyrene derivative, a pyridine derivative, a rhodamine derivative, an aquidine derivative, phenoxazone, a quinacridone derivative, rubrene, poly-p-phenylenevinylene, and polysilane.

The electron transport layer 73 migrates electrons to the light-emitting layer 72 efficiently. Examples of the material of the electron transport layer 73 include an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, and a metal oxinoid compound.

The electron injection layer 74 is also referred to as a cathode electrode buffer layer. The electron injection layer 74 reduces the energy level difference between the second electrode 54 and the organic EL layer 53, and improves the efficiency of electron injection into the organic EL layer 53 from the second electrode 54. Examples of the material of the electron injection layer 74 include inorganic alkaline compounds such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), and strontium oxide (SrO).

Second Electrode

The second electrode 54 has the same configuration in the first display region D1 and in the second display region D2. The second electrode 54 is provided commonly for the plurality of subpixels Sp. The second electrode 54 covers the organic EL layer 53 and the edge cover 52, and overlaps with the first electrode 51 with the organic EL layer 53 interposed therebetween. The second electrode 54 functions as a cathode electrode that injects electrons into the organic EL layer 53. The second electrode 54 has optical transparency to transmit light.

Examples of the material of the second electrode 54 include silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), and lithium fluoride (LiF).

The second electrode 54 may be formed of an alloy such as magnesium (Mg)-copper (Cu), magnesium (Mg)-silver (Ag), sodium (Na)-potassium (K), astatine (At)-astatine oxide ($AtO_2$), lithium (Li)-aluminum (Al), lithium (Li)-calcium (Ca)-aluminum (Al), lithium fluoride (LiF)-calcium (Ca)-aluminum (Al) and the like, for example.

The second electrode 54 may be formed of a conductive oxide, such as tin oxide (SnO), zinc oxide (ZnO), indium tin oxide (ITO), and indium zinc oxide (IZO), for example. The second electrode 54 is preferably formed of a material having a low work function to improve the efficiency of electron injection into the organic EL layer 53. The second electrode 54 may be formed by layering a plurality of layers formed of any of the materials described above.

Configuration of Each Subpixel in First Display Region and Second Display Region In the first display region D1 and the second display region D2, the configuration of the subpixel Sp, more specifically, the mode of each of the relay conductive portion 35cp, the upper layer contact hole 36h, and the organic EL element 60 is different.

The plurality of organic EL elements 60 included in the light-emitting element layer 50 include a plurality of first organic EL elements 60A (see FIG. 7) located in the first display region D1, and a plurality of second organic EL elements 60B (see FIG. 8) located in the second display region D2. As illustrated in FIG. 7, FIG. 8, and FIG. 10, the first organic EL element 60A and the second organic EL element 60B are different from each other in the size and shape of the first electrode 51, and the size and shape of a light-emitting portion in which the light-emitting layer 72 is sandwiched between the first electrode 51 and the second electrode 54.

The size of the first electrode 51 of the second organic EL element 60B is smaller than the size of the first electrode 51 of the first organic EL element 60B. In a plan view, the area of the first electrode 51 of the second organic EL element 60B is smaller than the area of the first electrode 51 of the first organic EL element 60A. The first electrode 51 blocks the light transmitted from the front face side of the display region D, on which an image is displayed, to the back face side thereof, on which the camera 3 is disposed (indicated by two-dot chain lines in FIG. 7 and FIG. 8, and also indicated in the same manner in FIG. 11, FIG. 14, FIG. 16, FIG. 18, and FIG. 19 to be described below). Thus, the configuration in which the area of the first electrode 51 of the second organic EL element 60B is relatively small contributes to increasing the transmittance of the light utilized by the camera 3 in the second display region D2.

In the edge cover 52, the opening 68 exposing the first electrode 51 of the first organic EL element 60A and the opening 68 exposing the first electrode 51 of the second organic EL element 60B are different from each other in size. In a plan view, the opening area of the opening 68 exposing the first electrode 51 of the second organic EL element 60B is smaller than the opening area of the opening 68 exposing the first electrode 51 of the first organic EL element 60A. In other words, the area of the light-emitting region E of each of the subpixels Sp in the second display region D2 is smaller than the area of the light-emitting region E of each of the subpixels Sp in the first display region D1. Here, the "area of opening 68" refers to the area of a region surrounded by the edge of the opening 68 on the first electrode 51 side.

The organic EL layer 53 of the first organic EL element 60A and the organic EL layer 53 of the second organic EL element 60B are each formed inside the opening 68 of the edge cover 52 and in a region including a peripheral portion of the opening 68, while having the same size and the same shape as each other. In a plan view, the area of the organic EL layer 53 of the first organic EL element 60A and the area of the organic EL layer 53 of the second organic EL element 60B are equivalent to each other. Here, the "area of the organic EL layer 53" refers to the area in a plan view of a region, of the organic EL layer 53, in which the individual light-emitting layer 72 is provided. The organic EL layer 53 of the first display region D1 and the organic EL layer 53 of the second display region D2, whose areas are equivalent to each other in a plan view, can be formed at the same time by a vapor deposition without changing a film formation mask.

The plurality of connecting conductive portions 28*cp* include first connecting conductive portions 28*cp*1 provided for each of the first organic EL elements 60A and located in the first display region D1, and second connecting conductive portions 28*cp*2 provided for each of the second organic EL elements 60B and located in the second display region D2. The first connecting conductive portion 28*cp*1 is a conductive portion for connecting the first electrode 51 of the first organic EL element 60A to the sixth TFT 30*f*. The second connecting conductive portion 28*cp*2 is a conductive portion for connecting the first electrode 51 of the second organic EL element 60B to the sixth TFT 30*f*. These first connecting conductive portion 28*cp*1 and second connecting conductive portion 28*cp*2 are formed in the same size and the same shape as each other, for example.

The plurality of lower layer contact holes 34*h* in the lower layer flattening film 34 include first lower layer contact holes 34*h*1 provided for each of the first organic EL elements 60A and located in the first display region D1, and second lower layer contact holes 34*h*2 provided for each of the second organic EL elements 60B and located in the second display region D2. The first lower layer contact hole 34*h*1 is a contact hole for connecting the first electrode 51 of the first organic EL element 60A to the sixth TFT 30*f*. The second lower layer contact hole 34*h*2 is a contact hole for connecting the first electrode 51 of the second organic EL element 60B to the sixth TFT 30*f*. These first lower layer contact hole 34*h*1 and second lower layer contact hole 34*h*2 are formed in the same size and the same shape as each other, for example.

Each of the first lower layer contact hole 34*h*1 and the second lower layer contact hole 34*h*2 is widened toward the front face side of the display region D, and has an inner peripheral surface inclined at a predetermined inclination angle $\alpha 1$, $\alpha 2$ in a direction facing the front face side of the display region D with respect to the planar direction of the resin substrate layer 10 (direction orthogonal to the thickness direction of the resin substrate layer 10, and the same will apply below) in the display region D. The inclination angle $\alpha 2$ formed by the inner peripheral surface of the second lower layer contact hole 34*h*2 and the inclination angle $\alpha 1$ formed by the inner peripheral surface of the first lower layer contact hole 34*h*1, with respect to the planar direction of the resin substrate layer 10 in the display region D, are equivalent to each other.

The plurality of relay conductive portions 35*cp* include first relay conductive portions 35*cp*1 provided for each of the first organic EL elements 60A and located in the first display region D1, and second relay conductive portions 35*cp*2 provided for each of the second organic EL elements 60B and located in the second display region D2. The first relay conductive portion 35*cp*1 is a conductive portion for connecting the first electrode 51 of the first organic EL element 60A to the sixth TFT 30*f*. The second relay conductive portion 35*c*2 is a conductive portion for connecting the first electrode 51 of the second organic EL element 60B to the sixth TFT 30*f*. The first relay conductive portion 35*cp*1 and the second relay conductive portion 35*cp* 2 are different from each other in size and shape.

The plurality of upper layer contact holes 36*h* in the upper layer flattening film 36 include first upper layer contact holes 36*h*1 provided for each of the first organic EL elements 60A and located in the first display region D1, and second upper layer contact holes 36*h*2 provided for each of the second organic EL elements 60B and located in the second display region D2. Here, the first upper layer contact hole 36*h*1 corresponds to a first contact hole. The second upper layer contact hole 36*h*2 corresponds to a second contact hole. These first upper layer contact hole 36*h*1 and second upper layer contact hole 36*h*2 are different from each other in size and a positional relationship with respect to the edge cover 52 and the light-emitting region E.

Each of the first upper layer contact hole 36*h*1 and the second upper layer contact hole 36*h*2 is widened toward the front face side of the display region D, and has an inner peripheral surface (with respect to the second upper layer contact hole 36*h*2, a hatched portion with diagonal lines extending upward to the right in FIG. 10, and the same will apply in FIG. 12, FIG. 13, FIG. 15, and FIG. 17 to be described below) inclined at predetermined inclination angles $\beta 1$, $\beta 2$ in the direction facing the front face side of the display region D with respect to the planar direction of the resin substrate layer 10 in the display region D. With respect to the planar direction of the resin substrate layer 10 in the display region D, the inclination angle $\beta 2$ formed by the inner peripheral surface of the second upper layer contact hole 36*h*2 is less than the inclination angle $\beta 1$ formed by the inner peripheral surface of the first upper layer contact hole 36*h*1.

As illustrated in FIG. 7 and FIG. 10, in the first display region D1, each of the first upper layer contact hole 36*h*1, the relay conductive portion 35, and the first lower layer contact hole 34*h*1 for connecting the first electrode 51 of each of the first organic EL elements 60A to the drain electrode 28*de* of the sixth TFT 30*f* is located at a position overlapping with the edge cover 52. The first electrode 51 of each of the first organic EL elements 60A is formed in a flat shape on the inner side of the opening 68 of the edge cover 52. The first electrode 51 of each of the first organic EL elements 60A includes an extending portion 51*a* that extends from a position corresponding to the opening 68 of the edge cover 52 to a position overlapping with the edge cover 52.

The extending portion 51*a* of the first electrode 51 of each of the first organic EL elements 60A is connected to the first relay conductive portion 35*cp*1 through the first upper layer contact hole 36*h*1. In a plan view, the first relay conductive portion 35*cp*1 does not extend into the light-emitting region E of the subpixel Sp in which the first organic EL element 60A is provided. The first relay conductive portion 35*cp*1 may extend into the light-emitting region E in an area smaller than the area of a portion located in the light-emitting region E of the subpixel Sp of the second relay conductive portion 35, which will be described below.

The first relay conductive portion 35*cp*1 is connected to the first connecting conductive portion 28*cp*1 through the first lower layer contact hole 34*h*1 at a position overlapping with the edge cover 52. The organic EL layer 53 of each of the first organic EL elements 60A overlaps with the flat first electrode 51, which is exposed from the bottom of the opening 68 of the edge cover 52. In each of the subpixels Sp of the first display region D1, the second electrode 54 overlaps with the flat organic EL layer 53 inside the opening 68 of the edge cover 52.

As illustrated in FIG. 8 and FIG. 10, in the second display region D2, the second upper layer contact hole 36*h*2 for connecting the first electrode 51 of each of the second organic EL elements 60B to the drain electrode 28*de* of the sixth TFT 30*f* is located at a position corresponding to the opening 68 of the edge cover 52, namely, at the light-emitting region E in a plan view. The second upper layer contact hole 36*h*2 is located inside the opening 68 of the edge cover 52, and is formed in a geometrically similar shape to that of the opening 68 so that the peripheral edge thereof is in close proximity to the peripheral edge of the opening 68 of the edge cover 52. The opening area of the second upper layer contact hole 36h2 is greater than the opening area of the first upper layer contact hole 36h1. Here, the "opening area" refers to the area of the opening of the widened side of the upper layer contact hole 36h (front face side of the display region D).

The first electrode 51 of each of the second organic EL elements 60B is provided inside the second upper layer contact hole 36h2 in the upper layer flattening film 36 and in a region including a peripheral portion thereof, while being formed in a concave shape. The first electrode 51 of each of the second organic EL elements 60B does not include a portion extending sideways similar to the extending portion 51a of the first electrode 51 of the first organic EL element 60A. The first electrode 51 of each of the second organic EL elements 60B covers the inner peripheral surface of the second upper layer contact hole 36h2 inside the opening 68 of the edge cover 52, and overlaps with the flat second relay conductive portion 35cp2 that is exposed from the bottom of the second upper layer contact hole 36h2.

The second relay conductive portion 35cp2 extends from a position corresponding to the opening 68 of the edge cover 52 to a position overlapping with the edge cover 52 at the outer periphery of the opening 68. In the second display region D2, the second lower layer contact hole 34h2 is located at a position, of the lower layer flattening film 34, overlapping with the edge cover 52. The second relay conductive portion 35cp2 is connected to the second connecting conductive portion 28cp2 through the second lower layer contact hole 34h2 at a position overlapping with the edge cover 52.

The organic EL layer 53 of each of the second organic EL elements 60B is provided in a region including the inside of the second upper layer contact hole 36h2, on the inner side of the opening 68 of the edge cover 52. The organic EL layer 53 of the second organic EL element 60B overlaps with the first electrode 51 exposed to the inner side of the opening 68 of the edge cover 52, and is formed in a concave shape having a depth deeper than that of the organic EL layer 53 of the first organic EL element 60A while following the surface shape of the first electrode 51.

In each of the subpixels Sp of the second display region D2, the second electrode 54 is provided in a region including the inside of the second upper layer contact hole 36h2. The second electrode 54 overlaps with the organic EL layer 53 of the second organic EL element 60B on the inner side of the opening 68 of the edge cover 52, and is formed in a concave shape having a depth deeper than that of a portion constituting the first organic EL element 60A while following the surface shape of the organic EL layer 53.

Sealing Film

As illustrated in FIG. 5, the sealing film 80 is provided so as to cover the plurality of organic EL elements 60. The sealing film 80 protects the organic EL layer 53 of each of the organic EL elements 60 from moisture, oxygen, or the like. The sealing film 80 includes a first inorganic sealing layer 81 provided so as to cover the second electrode 54, an organic sealing layer 82 provided on the first inorganic sealing layer 81, and a second inorganic sealing layer 83 provided on the organic sealing layer 82.

The first inorganic sealing layer 81 and the second inorganic sealing layer 83 are formed of, for example, an inorganic insulating film such as a silicon oxide film, a silicon nitride film, and a silicon oxynitride film. The organic sealing layer 82 is formed of an organic material such as an acrylic resin, an epoxy resin, a silicone resin, a polyurea resin, a parylene resin, a polyimide resin, and a polyamide resin, for example. The sealing film 80 is covered by a surface protection film (not illustrated) bonded to the front face side of the organic EL display device 1.

Operation of Organic EL Display Device

In the organic EL display device 1 having the configuration described above, first, in each of the subpixels Sp, the organic EL element 60 is brought into a non-light emission state when the corresponding emission control wiring line 24el is selected to be in the inactive state. Then, when the gate wiring line 24gl is selected that is to be scanned immediately before the gate wiring line 24gl corresponding to the organic EL element 60 in the non-light emission state, the gate signal is input to the first TFT 30a via that gate wiring line 24gl, the first TFT 30a and the fourth TFT 30d are brought into an on state, and the voltage of the initialization power source wiring line 26il is applied to the capacitor 32. As a result, the charge of the capacitor 32 is discharged, and the voltage applied to the gate electrode 24ge of the fourth TFT 30d is initialized.

Subsequently, when the gate wiring line 24gl corresponding to the organic EL element 60 in the non-light emission state is selected to be in the active state, the second TFT 30b and the third TFT 30c are brought into the on state, and a predetermined voltage corresponding to the source signal transmitted via the source wiring line 28sl is written to the capacitor 32 via the fourth TFT 30d in the diode-connected state. Further, the seventh TFT 30g is brought into the on state, the voltage of the initialization power source wiring line 26il is applied to the first electrode 51 of the organic EL element 60, and the charge accumulated in the first electrode 51 is reset.

Thereafter, when the emission control wiring line 24el corresponding to the organic EL element 60 in the non-light emission state is unselected to be in the active state, the fifth TFT 30e and the sixth TFT 30f are brought into the on state, and a drive current corresponding to the voltage applied to the gate electrode 24ge of the fourth TFT 30d is supplied from the high-level power source wiring line Pl to the organic EL element 60. In this way, each of the organic EL elements 60 emits light at a luminance corresponding to the drive current. As a result, an image is displayed in the display region D of the organic EL display device 1.

Manufacturing Method of Organic EL Display Device

In order to manufacture the organic EL display device 1 as described above, first, the resin substrate layer 10 is formed, for example, by applying a resin material onto the front face of a glass substrate. Subsequently, the TFT layer 20, the light-emitting element layer 50, and the sealing film 80 are sequentially formed on the resin substrate layer 10. Then, the glass substrate is peeled from the resin substrate layer 10, for example, by irradiating the back face of the resin substrate layer 10 from the glass substrate side with laser light, and the back face protection film 11 is bonded to the back face of the resin substrate layer 10.

Further, a front face protection film is bonded to the front face of the substrate on which the sealing film 80 is provided. Subsequently, by connecting the wiring line substrate Cb to the terminal portion T of the organic EL display device 1, an external circuit such as a display control circuit is mounted together with the wiring line substrate Cb. Thereafter, the organic EL display device 1 is housed in the housing together with the camera 3, and the camera 3 is installed at a position overlapping with the second display region D2 in a plan view on the back face side of the organic EL display device 1.

When manufacturing the organic EL display device 1, in a step of forming the TFT layer 20, a photosensitive resin material is applied onto the substrate on which the fourth conductive layer 35 (third power source wiring line 351 and relay conductive portion 35cp) is formed, for example, using a known coating method such as spin coating. Subsequently, the upper layer flattening film 36 is formed by performing pre-baking, exposure processing, developing processing, and post-baking on a coating film formed of the photosensitive resin material, and patterning the coating film. At this time, it is sufficient that each of the first upper layer contact holes 36h1 located in the first display region D1 and each of the second upper layer contact holes 36h2 located in the second display region D2 be formed so as to be different from each other in the inclination angles β1, β2 at the inner peripheral surface and the opening area, as described above, by performing or not performing middle-baking before the pre-baking, or adjusting i-line UV exposure in accordance with the type of photosensitive resin material.

Further, in a step of forming the light-emitting element layer 50, a conductive oxide film or a metal film is formed by layering a single layer or a plurality of layers on the substrate on which the TFT layer 20 is formed, for example, using a sputtering method, to form a conductive film. Subsequently, the conductive film is patterned by photolithography to form the plurality of first electrodes 51. At this time, each of the first electrodes 51 located in the first display region D1 and each of the first electrodes 51 located in the second display region D2 may be formed so as to be different from each other in the area thereof in a plan view as described above.

Characteristics and Effects of First Embodiment

A characteristic (1) of the organic EL display device 1 according to the first embodiment is that the area of the first electrode 51 of the second organic EL element 60B located in the second display region D2 is smaller than the area of the first electrode 51 of the first organic EL element 60A located in the first display region D1, the first upper layer contact hole 36h1 for connecting the first electrode 51 of the first organic EL element 60A to the sixth TFT 30f is located at the position overlapping with the edge cover 52, the second upper layer contact hole 36h2 for connecting the first electrode 51 of the second organic EL element 60B to the sixth TFT 30f is located at the position corresponding to the opening 68 of the edge cover 52, and the first electrode 51, the organic EL layer 53, and the second electrode 54 of the second organic EL element 60B are provided in the region, of the upper layer flattening film 36, including the inside of the second upper layer contact hole 36h2.

According to the characteristic (1) of the organic EL display device 1 according to the first embodiment, since the area of the first electrode 51 of the second organic EL element 60B is smaller than the area of the first electrode 51 of the first organic EL element 60A, in the second display region D2, the amount of external light reflected by the first electrode 51 can be reduced to increase the amount of light transmitted therethrough, and increase the transmittance of the light utilized for the image capture by the camera 3. Further, since the first upper layer contact hole 36h1 is located at the position overlapping with the edge cover 52, the first electrode 51, the organic EL layer 53, and the second electrode 54 of the first organic EL element 60A are not provided inside the first upper layer contact hole 36h1.

On the other hand, the second upper layer contact hole 36h2 is located at the position corresponding to the opening 68 of the edge cover 52. Then, since the first electrode 51, the organic EL layer 53, and the second electrode 54 of the second organic EL element 60B are provided in the region, of the upper layer flattening film 36, including the inside of the second upper layer contact hole 36h2, the second organic EL element 60B can emit light inside the second upper layer contact hole 36h2. As a result, since the substantial area of the light-emitting portion of the second organic EL element 60B is increased compared to a case in which the second organic EL element 60B cannot be caused to emit light inside the second upper layer contact hole 36h2, in the second display region D2, a reduction in the luminance of each of the subpixels Sp can be suppressed even though the area of the light-emitting region E is relatively small.

A characteristic (2) of the organic EL display device 1 according to the first embodiment is that the opening area of the second upper layer contact hole 36h2 is greater than the opening area of the first upper layer contact hole 36h1.

According to the characteristic (2) of the organic EL display device 1 according to the first embodiment, since the area of the inner peripheral surface of the second upper layer contact hole 36h2 is greater than the area of the inner peripheral surface of the first upper layer contact hole 36h1, the substantial area of the light-emitting portion of the second organic EL element 60B can be suitably increased compared to a case in which the opening area of the first upper layer contact hole 36h1 and the opening area of the second upper layer contact hole 36h2 are equivalent to each other.

A characteristic (3) of the organic EL display device 1 according to the first embodiment is that the area of the organic EL layer 53 of the first organic EL element 60A and the area of the organic EL layer 53 of the second organic EL element 60B are equivalent to each other.

According to the characteristics (3) of the organic EL display device 1 according to the first embodiment, each of the organic EL layers 53 in the first display region D1 and each of the organic EL layers 53 in the second display region D2, whose areas are equivalent to each other in a plan view, can be formed at the same time by the vapor deposition without changing the film formation mask. This contributes to manufacturing the organic EL display device 1 in an inexpensive manner. Further, since the film formation mask used in the vapor deposition is generally relatively thin and used in a fixed state while being pulled with an appropriate tension, at the time of its use, a positional shift of the opening can be suppressed, which is caused by variation in the strain applied to the shape of a film formation opening.

A characteristic (4) of the organic EL display device 1 according to the first embodiment is that the inclination angle β2 of the inner peripheral surface of the second upper layer contact hole 36h2 is less than the inclination angle β1 of the inner peripheral surface of the first upper layer contact hole 36h1, with respect to the planar direction of the resin substrate layer 10.

According to the characteristic (4) of the organic EL display device 1 according to the first embodiment, the area of the inner peripheral surface of the second upper layer contact hole 36h2 is increased compared to a case in which the inclination angle β1 of the inner peripheral surface of the first upper layer contact hole 36h1 and the inclination angle β2 of the inner peripheral surface of the second upper layer contact hole 36h2 are equivalent to each other. This is advantageous in increasing the substantial area of the light-emitting portion of the second organic EL element 60B.

A characteristic (5) of the organic EL display device 1 according to the first embodiment is that the upper layer flattening film 36 is formed by the acrylic resin.

According to the characteristic (5) of the organic EL display device 1 according to the first embodiment, the amount of external light transmitted through the upper layer flattening film 36 can be increased compared to a case in which the upper layer flattening film 36 is formed by the polyimide resin. As a result, the transmittance of the light utilized for the image capture by the camera 3 can be increased in the second display region D2.

First Modified Example of First Embodiment

Figure 11:
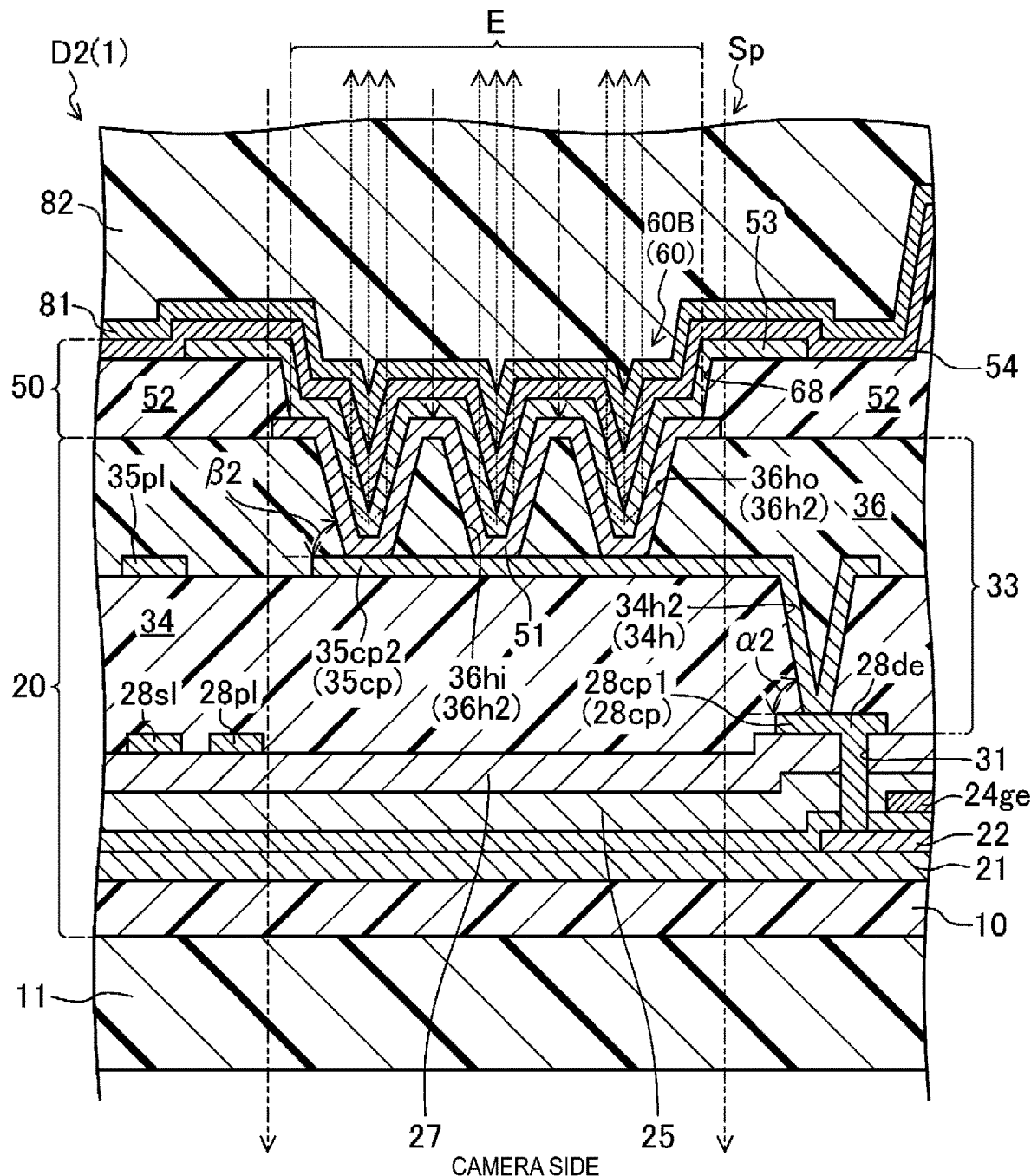
FIG. 11 is a cross-sectional view illustrating main portions in the second display region of the organic EL display device according to a first modified example of the first embodiment.
Figure 12:
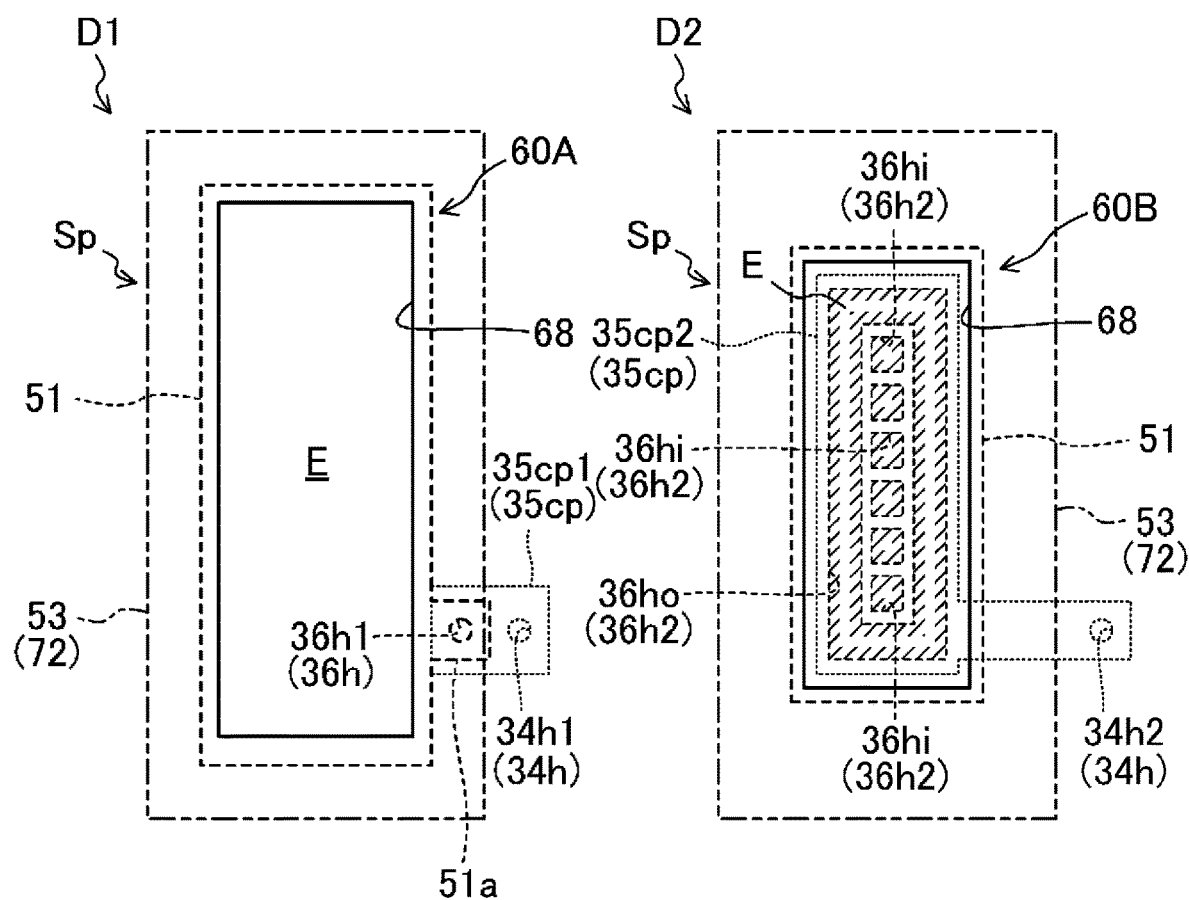
FIG. 12 is a plan view illustrating a configuration of each of the light-emitting regions in the first display region and the second display region of the organic EL display device according to the first modified example of the first embodiment, and of the periphery thereof.

FIG. 11 is a cross-sectional view illustrating main portions of the second display region D2 of the organic EL display device 1 according to a first modified example of the first embodiment. FIG. 12 is a plan view illustrating a configuration of each of the light-emitting regions E in the first display region D1 and the second display region D2 of the organic EL display device 1 according to the first modified example of the first embodiment, and of the periphery thereof.

In the organic EL display device 1 according to the first embodiment, it is assumed that the second upper layer contact hole 36$h$2 is formed for each of the second organic EL elements 60B in a one-to-one manner in the upper layer flattening film 36, but as illustrated in FIG. 11 and FIG. 12, in the organic EL display device 1 according to the present modified example, a plurality of the second upper layer contact holes 36$h$2 are formed for each of the second organic EL elements 60B in the upper layer flattening film 36.

Specifically, the plurality of second upper layer contact holes 36$h$2 include an outer contact hole 36$ho$ having a frame shape, and a plurality of inner contact holes 36$hi$ each formed inside the outer contact hole 36$ho$ and having a pinhole shape. The outer contact hole 36$ho$ extends along the peripheral edge of the opening 68 of the edge cover 52. The plurality of inner contact holes 36$hi$ are arrayed with a predetermined interval between each other.

In FIG. 12, a case is illustrated in which the plurality of inner contact holes 36$hi$ are aligned in a single row, but the plurality of inner contact holes 36$hi$ may be arranged in a matrix shape, or may be provided with another arrangement. Further, an example in which the outer contact hole 36$ho$ has the rectangular frame shape in a plan view is illustrated in FIG. 12, but the outer contact hole 36$ho$ may have another frame shape such as a circular shape or an elliptical shape, other than the rectangular shape. An example is illustrated in FIG. 12 in which the individual inner contact hole 36$hi$ has the rectangular pinhole shape in a plan view, but the individual inner contact hole 36$hi$ may have another pinhole shape such as a circular shape or an elliptical shape, other than the rectangular shape.

The inclination angle $\beta$2 formed by the inner peripheral surface of the outer contact hole 36$ho$ and the inclination angle $\beta$2 formed by the inner peripheral surface of each of the inner contact holes 36$hi$ with respect to the planar direction of the resin substrate layer 10 are less than the inclination angle $\alpha$1 formed by the inner peripheral surface of the first upper layer contact hole 36$h$1. The opening area of the second upper layer contact hole 36$h$2 is greater than the opening area of the first upper layer contact hole 36$h$1. Here, the "opening area of the second upper layer contact hole 36$h$2" refers to the total area obtained by adding up the opening area of the outer contact hole 36$ho$ and the opening area of each of the inner contact holes 36$hi$.

The first electrode 51 of the second organic EL element 60B is connected to the second relay conductive portion 35$cp$2 through the outer contact hole 36$ho$ and each of the inner contact holes 36$hi$. The first electrode 51 of the second organic EL element 60B is provided inside the outer contact hole 36$ho$ in the upper layer flattening film 36$a$ and in a peripheral portion thereof, and in a portion including the inside of each of the inner contact holes 36$hi$ surrounded by the outer contact hole 36$ho$. The first electrode 51 is formed in an uneven shape.

The organic EL layer 53 of the second organic EL element 60B is also provided inside the outer contact hole 36$ho$ and inside each of the inner contact holes 36$hi$, on the inner side of the opening 68 of the edge cover 52. The organic EL layer 53 of the second organic EL element 60B overlaps with the first electrode 51 exposed to the inner side of the opening 68 of the edge cover 52, and is formed in an uneven shape following the surface shape of the first electrode 51.

In the second display region D2, the second electrode 54 is also provided inside the outer contact hole 36$ho$ and inside each of the inner contact holes 36$hi$, on the inner side of the opening 68 of the edge cover 52. The second electrode 54 overlaps with the organic EL layer 53 of the second organic EL element 60B inside the opening 68 of the edge cover 52, and is formed in an uneven shape following the surface shape of the organic EL layer 53.

Characteristics and Effects of First Modified Example of First Embodiment

A characteristic (1) of the organic EL display device 1 according to the first modified example of the first embodiment is that the plurality of second upper layer contact holes 36$h$2 (36$ho$, 36$hi$) are formed for each of the second organic EL elements 60B, and the first electrode 51 of the second organic EL element 60B is connected to the sixth TFT 30$f$ through each of the plurality of second upper layer contact holes 36$h$2 (36$ho$, 36$hi$).

According to the characteristic (1) of the organic EL display device 1 according to the first modified example of the first embodiment, the substantial area of the portion in which the first electrode 51 is formed can be increased on the inner side of the opening 68 of the edge cover 52, compared to a case in which the second upper layer contact hole 36$h$2 is formed for each of the second organic EL elements 60B in a one-to-one manner in the upper layer flattening film 36.

A characteristic (2) of the organic EL display device 1 according to the first modified example of the first embodiment is that the outer contact hole 36$ho$ of the plurality of second upper layer contact holes 36$h$ is formed in the frame shape so as to extend along the peripheral edge of the opening 68 of the edge cover 52.

According to the characteristic (2) of the organic EL display device 1 according to first modified example of the first embodiment, since the outer contact hole 36$ho$ is formed in the frame shape, the opening area of the second upper layer contact hole 36$h$2 and the area of the inner peripheral surface thereof can be suitably increased. This is advantageous in increasing the substantial area of the portion in which the first electrode 51 is formed on the inner side of the opening 68 of the edge cover 52.

Due to the characteristics (1) and (2) of the present example described above, the substantial area of the portion in which the first electrode 51 is formed can be increased on the inner side of the opening 68 of the edge cover 52. As a result, the substantial area of the light-emitting portion of the second organic EL element 60B can be increased. This is preferable for suppressing the reduction in the luminance of each of the subpixels Sp in the second display region D2, even though the area of the light-emitting region E is relatively small.

Second Modified Example of First Embodiment

Figure 13:
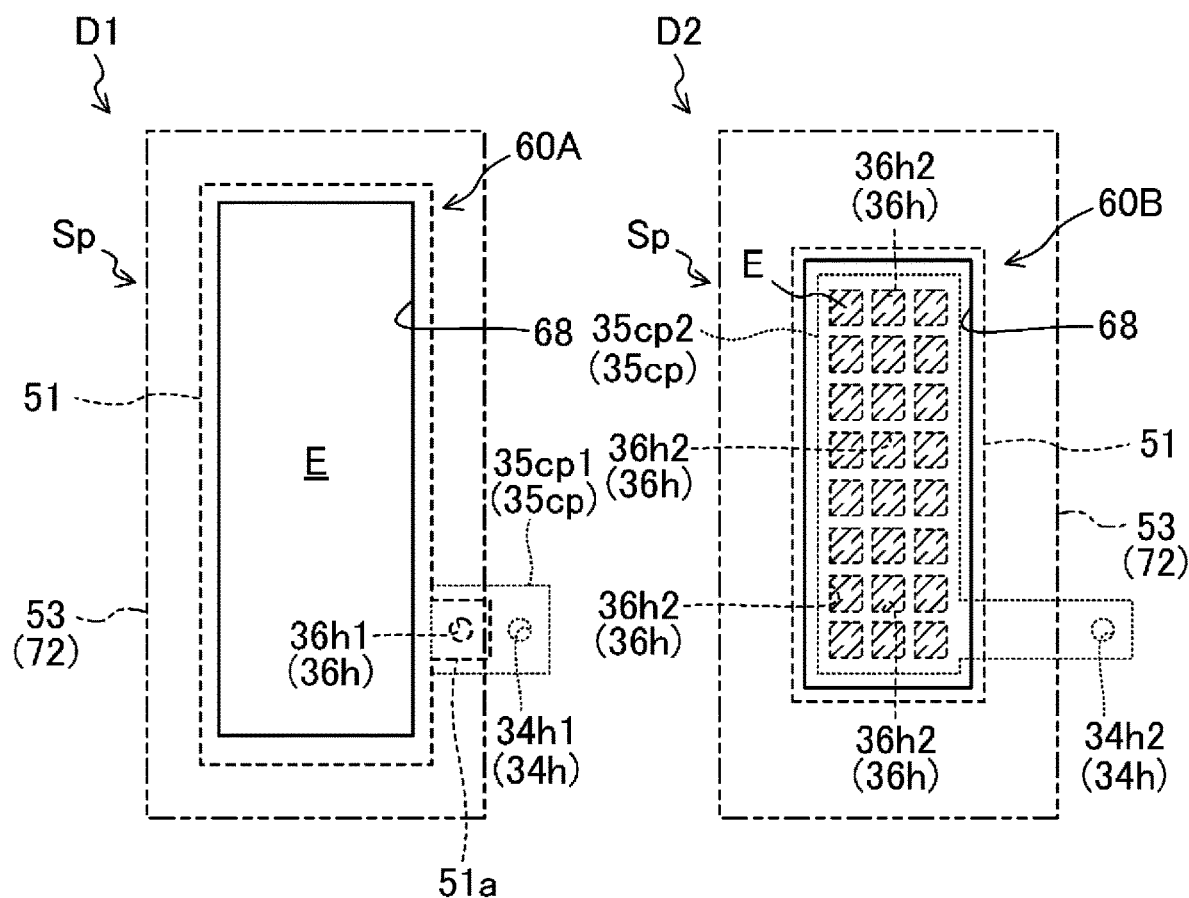
FIG. 13 is a plan view illustrating a configuration of each of the light-emitting regions in the first display region and the second display region of the organic EL display device according to a second modified example of the first embodiment, and of the periphery thereof.

FIG. 13 is a plan view illustrating a configuration of each of the light-emitting regions E in the first display region D1 and the second display region D2 of the organic EL display device 1 according to a second modified example of the first embodiment, and of the periphery thereof.

In the organic EL display device 1 according to the first modified example described above, the plurality of second upper layer contact holes 36h2 include the outer contact hole 36ho having the frame shape, and the plurality of inner contact holes 36hi each provided on the inner side of the outer contact hole 36ho and having the pinhole shape, but as illustrated in FIG. 13, in the organic EL display device 1 according to the present modified example, all of the plurality of second upper layer contact holes 36h2 are formed in a pinhole shape and are provided in a matrix shape. The plurality of second upper layer contact holes 36h2 may be aligned in a single row, or may be provided in another arrangement.

Characteristics and Effects of Second Modified Example of First Embodiment

Similarly to the first modified example, a characteristic of the organic EL display device 1 according to the second modified example of the first embodiment is that the plurality of second upper layer contact holes 36h2 are formed for each of the second organic EL elements 60B, and the first electrode 51 of the second organic EL element 60B is connected to the sixth TFT 30f through each of the plurality of second upper layer contact holes 36h2, and similar effects to those of the characteristic (1) of the organic EL display device 1 according to the first modified example can be obtained.

Second Embodiment

The organic EL display device 1 according to the second embodiment differs from the organic EL display device 1 according to the first embodiment in the configuration of the subpixel Sp in the second display region D2, specifically, in the arrangement of the sixth TFT 30f and the mode of each of the second relay conductive portion 35cp2, the second lower layer contact hole 34h2, and the second organic EL element 60B. Note that in the present embodiment, the configuration of the first electrode 51 of the second organic EL element 60B is different from that of the first embodiment, but otherwise, the organic EL display device 1 is similar to that of the first embodiment.

Figure 14:
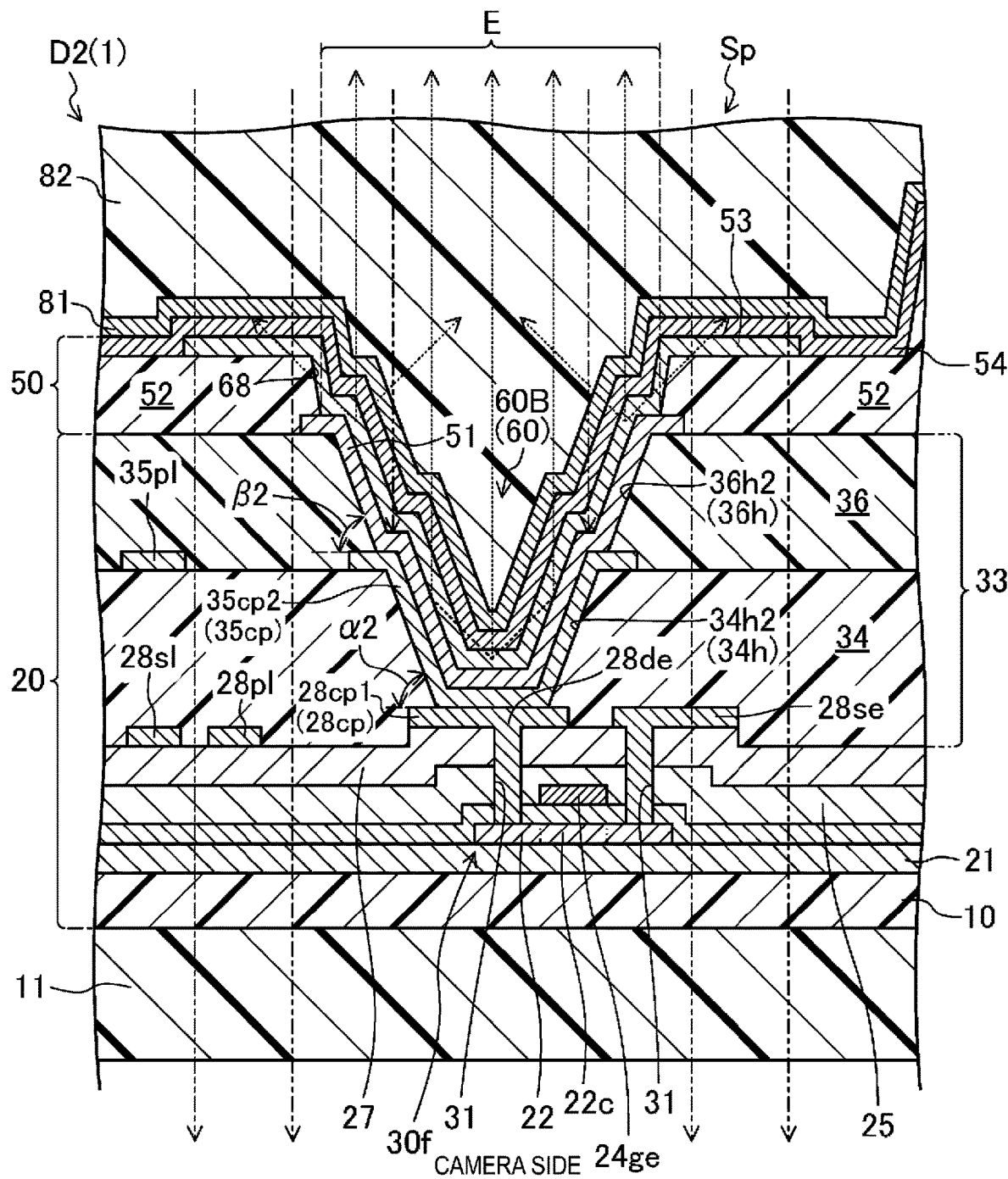
FIG. 14 is a cross-sectional view illustrating main portions in the second display region of the organic EL display device according to a second embodiment.
Figure 15:
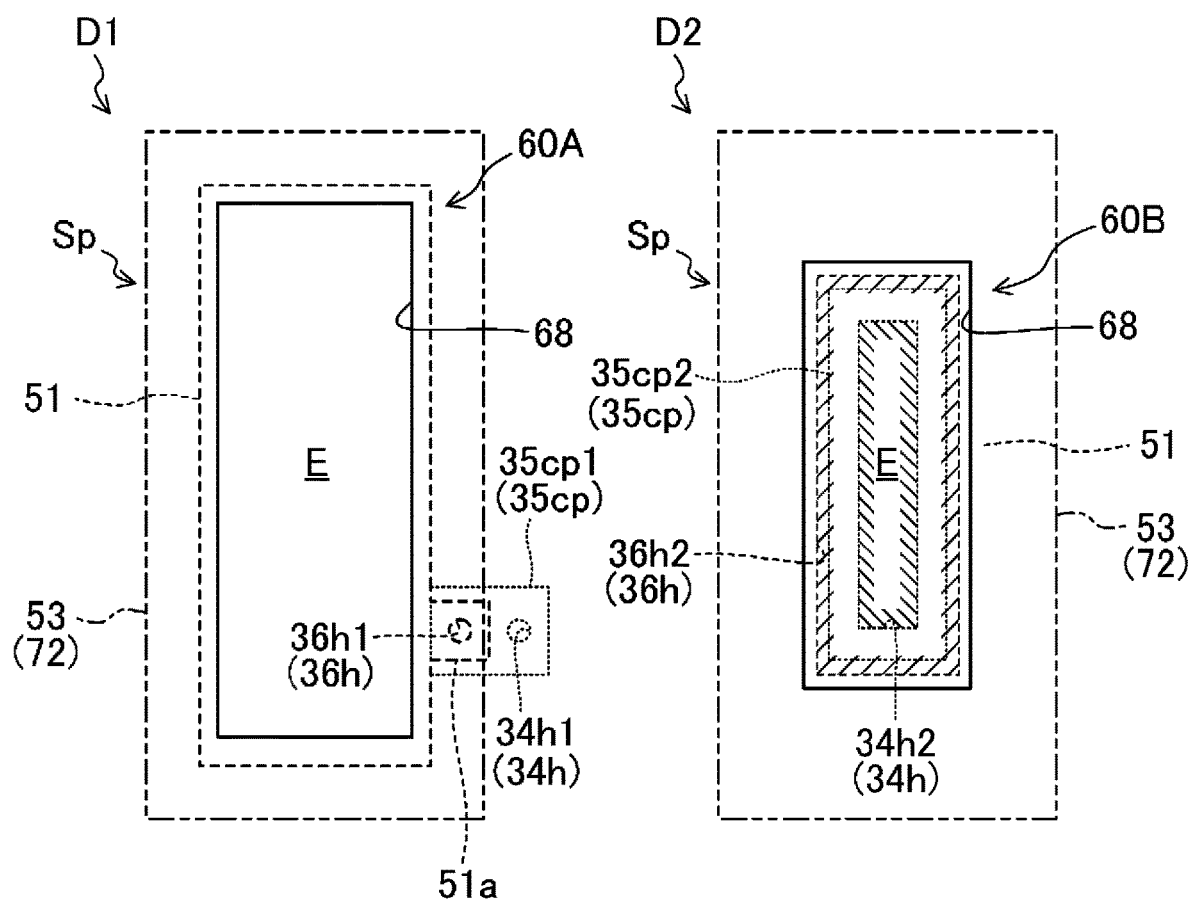
FIG. 15 is a plan view illustrating a configuration of each of the light-emitting regions in the first display region and the second display region of the organic EL display device according to the second embodiment, and of the periphery thereof.

FIG. 14 is a cross-sectional view illustrating main portions of the second display region D2 of the organic EL display device 1 according to the second embodiment. FIG. 15 is a plan view illustrating a configuration of each of the light-emitting regions E in the first display region D1 and the second display region D2 of the organic EL display device 1 according to the second embodiment, and of the periphery thereof.

As illustrated in FIG. 14 and FIG. 15, in a plan view, the sixth TFT 30f in each of the subpixels Sp in the second display region D2 is provided at a position at which the drain electrode 28de overlaps with the first electrode 51 of the second organic EL element 60B. The arrangement of the sixth TFT 30f with respect to the first electrode 51 of the second display region D2 is different from the arrangement of the sixth TFT 30f with respect to the first electrode 51 of the first display region D1. The arrangement of the sixth TFT 30f with respect to the first electrode 51 of the first display region D1 may be the same as the arrangement of the sixth TFT 30f with respect to the first electrode 51 of the second display region D2.

In each of the subpixels Sp of the second display region D2, the second upper layer contact hole 36h2 is positioned in a region corresponding to the opening 68 of the edge cover 52. The second lower layer contact hole 34h2 is located on the inner side of the second upper layer contact hole 36h2, and formed in a geometrically similar shape to that of the second upper layer contact hole 36h2 so that the peripheral edge of the opening is in close proximity to the peripheral edge of the second upper layer contact hole 36h2. The opening area of the second lower layer contact hole 34h2 is greater than the opening area of the first lower layer contact hole 34h1. Here, the "opening area" refers to the area of the opening on the widened side of the lower layer contact hole 34h (front face side of the display region D).

Each of the first lower layer contact hole 34h1 and the second lower layer contact hole 34h2 is widened toward the front face side of the display region D, and has the inner peripheral surface (with respect to the second lower layer contact hole 34h2, a hatched portion with diagonal lines extending upward to the left in FIG. 15, and the same will apply in FIG. 17 to be described below) inclined at the predetermined inclination angles α1, α2 in the direction facing the front face side of the display region D with respect to the planar direction of the resin substrate layer 10 in the display region D. With respect to the planar direction of the resin substrate layer 10 in the display region D, the inclination angle α2 formed by the inner peripheral surface of the second lower layer contact hole 34h2 is less than the inclination angle α1 formed by the inner peripheral surface of the first lower layer contact hole 34h1.

In each of the subpixels Sp in the second display region D2, the second relay conductive portion 35cp2 is provided inside the second lower layer contact hole 34h2 and in a region including a peripheral portion thereof, while being formed in a concave shape. In the light-emitting region E, the second relay conductive portion 35c2 covers the inner peripheral surface of the second lower layer contact hole 34h2, and overlaps with the second connecting conductive portion 28cp2 exposed from the bottom of the second lower layer contact hole 34h2.

In a plan view, the area of the second relay conductive portion 35cp2 is greater than the area of the first relay conductive portion 35cp1. In each of the subpixels Sp in the second display region D2, the second relay conductive portion 35cp2 is housed inside a region in which the first electrode 51 is provided in a plan view. Further, in a plan view, the area of the second connecting conductive portion 28cp2 is greater than the area of the first connecting conductive portion 28cp1. In each of the subpixels Sp in the second display region D2, the second connecting conductive portion 28cp2 is housed inside the region in which the first electrode 51 of the second organic EL element 60B is provided in a plan view. In each of the subpixels Sp in the second display region D2, the first electrode 51 of the second organic EL element 60B covers the inner peripheral surface of the second upper layer contact hole 36h2 and the inner peripheral surface of the second lower layer contact hole 34h2 inside the opening 68 of the edge cover 52. The first electrode 51 of the second organic EL element 60B overlaps with the second relay conductive portion 35cp2 exposed to the inner side of the second upper layer contact hole 36h2, and has a concave shape having a depth deeper than that of the first electrode 51 of the first organic EL element 60A. Similarly to the first embodiment, the first electrode 51 of the second organic EL element 60B does not have the portion extending sideways similar to the extending portion 51a of the first electrode 51 of the first organic EL element 60A.

In each of the subpixels Sp in the second display region D2, the organic EL layer 53 of the second organic EL element 60B is provided in a region including the inside of the second lower layer contact hole 34h2 and the inside of the second upper layer contact hole 36h2. The organic EL layer 53 of the second organic EL element 60B overlaps with the first electrode 51 exposed to the inner side of the opening 68 of the edge cover 52, and is formed in a concave shape having a depth deeper than that of the organic EL layer 53 of the first organic EL element 60A while following the surface shape of the first electrode 51.

In each of the subpixels Sp of the second display region D2, the second electrode 54 is provided in the region including the inside of the second lower layer contact hole 34h2 and the inside of the second upper layer contact hole 36h2. The second electrode 54 overlaps with the organic EL layer 53 of the second organic EL element 60B inside the opening 68 of the edge cover 52, and is formed in a concave shape having a depth deeper than that of the portion constituting the first organic EL element 60A while following the surface shape of that organic EL layer 53.

Characteristics and Effects of Second Embodiment

A characteristic (1) of the organic EL display device 1 according to the second embodiment is that the area of the second relay conductive portion 35cp2 is greater than the area of the first relay conductive portion 35cp1, and the second relay conductive portion 35cp2 is housed inside the region in which the first electrode 51 of the second organic EL element 60B is provided in a plan view.

According to the characteristic (1) of the organic EL display device 1 according to the second embodiment, since the second relay conductive portion 35cp2 is housed inside the region in which the first electrode 51 of the second organic EL element 60B is provided in a plan view, the second relay conductive portion 35cp2 does not interfere with the light transmitted from the front face side to the back face side of the second display region D2, separately from the first electrode 51. This is advantageous in increasing the transmittance of the light utilized for the image capture by the camera 3 in the second display region D2.

A characteristic (2) of the organic EL display device 1 according to the second embodiment is that the area of the second connecting conductive portion 28cp2 is greater than the area of the first connecting conductive portion 28cp1, and the second connecting conductive portion 28cp2 is housed inside the region in which the first electrode 51 of the second organic EL element 60B is provided in a plan view.

According to the characteristic (2) of the organic EL display device 1 according to the second embodiment, since the second connecting conductive portion 28cp2 is housed inside the region in which the first electrode 51 of the second organic EL element 60B is provided in a plan view, the second connecting conductive portion 28cp2 does not interfere with the light transmitted from the front face side to the back face side of the second display region D2, separately from the first electrode 51. This is advantageous in increasing the transmittance of the light utilized for the image capture by the camera 3 in the second display region D2.

A characteristic (3) of the organic EL display device 1 according to the second embodiment is that the first lower layer contact hole 34h1 and the second lower layer contact hole 34h2 are widened toward the front face side of the display region D, and have the inner peripheral surface inclined at the predetermined inclination angles α1, α2 with respect to the planar direction of the resin substrate layer 10 in the display region D, and the inclination angle α2 of the inner peripheral surface of the second lower layer contact hole 34h2 is greater than the inclination angle α1 of the inner peripheral surface of the first lower layer contact hole 34h1.

According to a characteristic (3) of the organic EL display device 1 according to the second embodiment, the area of the inner peripheral surface of the second lower layer contact hole 34h2 is increased compared to a case in which the inclination angle α1 of the inner peripheral surface of the first lower layer contact hole 34h1 and the inclination angle α2 of the inner peripheral surface of the second lower layer contact hole 34h2 are equivalent to each other. This is advantageous in increasing the substantial area of the first electrode 51, and thus increasing the substantial area of the light-emitting portion of the second organic EL element 60B.

A characteristic (4) of the organic EL display device 1 according to the second embodiment is that the opening area of the second lower layer contact hole 34h2 is greater than the opening area of the first lower layer contact hole 34h1.

According to the characteristic (4) of the organic EL display device 1 according to the second embodiment, since the area of the inner peripheral surface of the second lower layer contact hole 34h2 is greater than the area of the inner peripheral surface of the first lower layer contact hole 34h1, the substantial area of the light-emitting portion of the second organic EL element 60B can be suitably increased compared to a case in which the opening area of the first lower layer contact hole 34h1 and the opening area of the second lower layer contact hole 34h2 are equivalent to each other.

A characteristic (5) of the organic EL display device 1 according to the second embodiment is that, in a plan view, a channel region 22c of the semiconductor layer 22 of the sixth TFT 30f connected to the first electrode 51 of the second organic EL element 60B is housed inside the region in which the first electrode 51 of the second organic EL element 60B is provided.

According to the characteristic (5) of the organic EL display device 1 according to the second embodiment, since the channel region 22c of the semiconductor layer 22 of the sixth TFT 30f overlaps with the first electrode 51 in a plan view, the contact resistance between the first electrode 51 and the sixth TFT 30f can be reduced, and also to inhibit the characteristics of the sixth TFT 30f from deteriorating due to light irradiation caused by light straying into the channel region 22c of the semiconductor layer 22.

Modified Example of Second Embodiment

Figure 16:
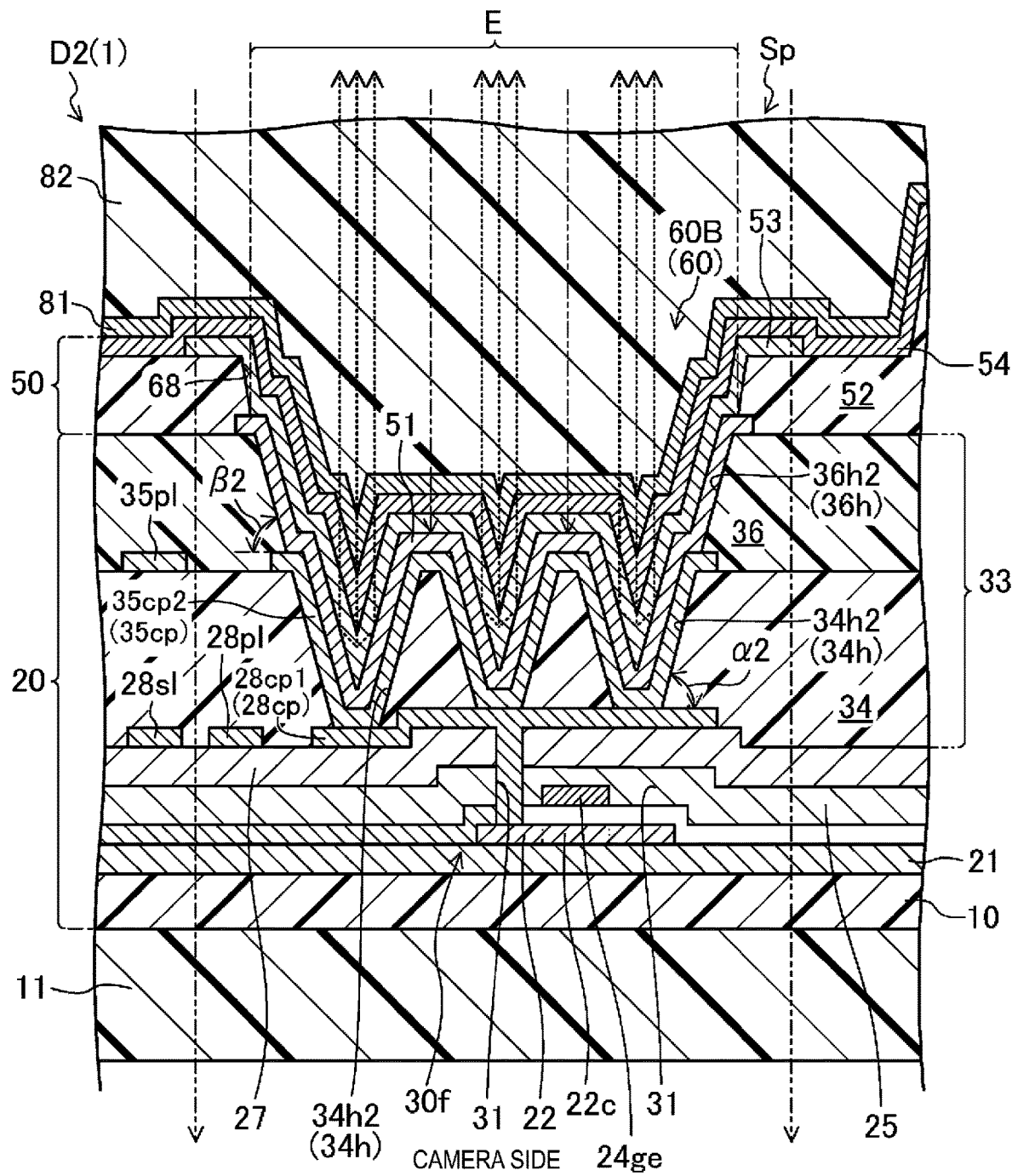
FIG. 16 is a cross-sectional view illustrating main portions in the second display region of the organic EL display device according to a modified example of the second embodiment.

FIG. 16 is a cross-sectional view illustrating main portions of the second display region D2 of the organic EL display device 1 according a modified example of the second embodiment. FIG. 17 is a plan view illustrating a configuration of each of the light-emitting regions E in the first display region D1 and the second display region D2 of the organic EL display device 1 according to the modified example of the second embodiment, and of the periphery thereof.

Figure 17:
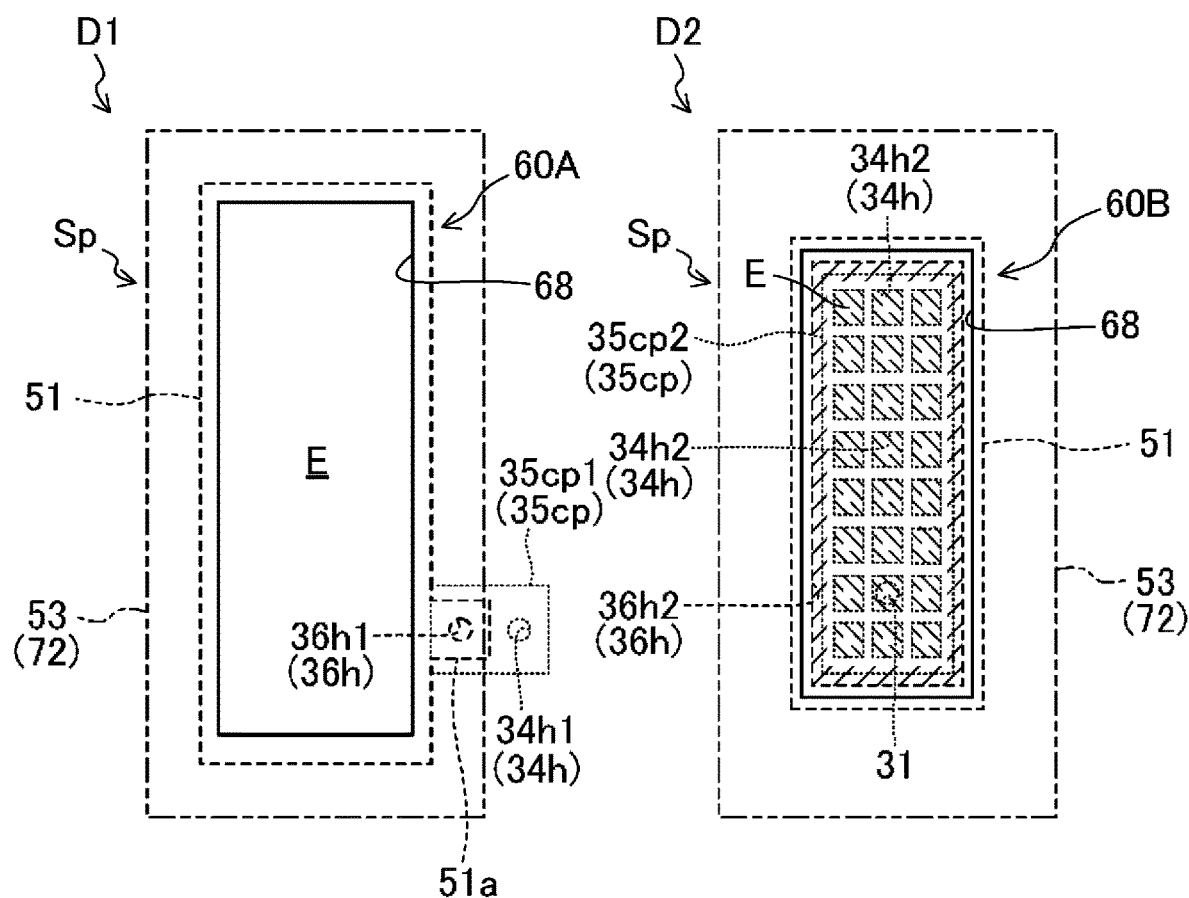
FIG. 17 is a plan view illustrating a configuration of each of the light-emitting regions in the first display region and the second display region of the organic EL display device according to the modified example of the second embodiment, and of the periphery thereof.

In the organic EL display device 1 according to the second embodiment, it is assumed that the second upper layer contact hole 36h2 is formed for each of the second organic EL elements 60B in the one-to-one manner in the upper layer flattening film 36, but as illustrated in FIG. 16 and FIG. 17, in the organic EL display device 1 according to the present modified example, a plurality of the second upper layer contact holes 36h2 are formed for each of the second organic EL elements 60B in the upper layer flattening film 36.

The plurality of second upper layer contact holes 36*h*2 are each formed in a pinhole shape and arranged in a matrix shape. The plurality of second upper layer contact holes 36*h*2 may be aligned in a single row, or may be provided in another arrangement. Further, an example is illustrated in FIG. 17 in which the individual second upper layer contact hole 36*h*2 has a rectangular pinhole shape in a plan view, but may have another pinhole shape such as a circular shape or an elliptical shape, other than the rectangular shape.

Similarly to the first embodiment, the opening area of the second upper layer contact hole 36*h*2 is greater than the opening area of the first upper layer contact hole 36*h*1. Further, with respect to the planar direction of the resin substrate layer 10, the inclination angle β2 formed by the inner peripheral surface of each of the second upper layer contact holes 36*h*2 is less than the inclination angle β1 formed by the inner peripheral surface of the first upper layer contact hole 36*h*1.

In each of the subpixels Sp of the second display region D2, the first electrode 51 of the second organic EL element 60B overlaps with the second relay conductive portion 35*cp*2 exposed to the inner side of each of the plurality of second upper layer contact holes 36*h*2. The first electrode 51 of the second organic EL element 60B is formed in a shape in which concave and convex sections are provided inside a concave portion including two level differences, following the surface shape of the second relay conductive portion 35*cp*2.

In each of the subpixels Sp in the second display region D2, the organic EL layer 53 of the second organic EL element 60B is provided inside the second upper layer contact hole 36*h*2 and in a region including the inside of the second lower layer contact hole 34*h*2. The organic EL layer 53 of the second organic EL element 60B overlaps with the first electrode 51 exposed to the inner side of the opening 68 of the edge cover 52, and is formed in the shape in which the concave and convex sections are provided inside the concave portion, following the surface shape of that first electrode 51.

In each of the subpixels Sp of the second display region D2, the second electrode 54 is provided in the region including the inside of the second lower layer contact hole 34*h*2 and the inside of the second upper layer contact hole 36*h*2. The second electrode 54 overlaps with the organic EL layer 53 of the second organic EL element 60B inside the opening 68 of the edge cover 52, and is formed in the shape in which the concave and convex sections are provided inside the concave portion, following the surface shape of that organic EL layer 53.

Characteristics and Effects of Modified Example of Second Embodiment

Similarly to the characteristic (1) of the organic EL display device 1 according to the second modified example described above, a characteristic (1) of the organic EL display device 1 according to the modified example of the second embodiment is that the plurality of second upper layer contact holes 36*h*2 are formed for each of the second organic EL elements 60B, and the first electrode 51 of the second organic EL element 60B is connected to the sixth TFT 30*f* through each of the plurality of second upper layer contact holes 36*h*2. Thus, similar effects to those of the characteristic (1) of the organic EL display device 1 according to the first modified example of the first embodiment described above can be obtained.

Other Embodiments

Figure 18:
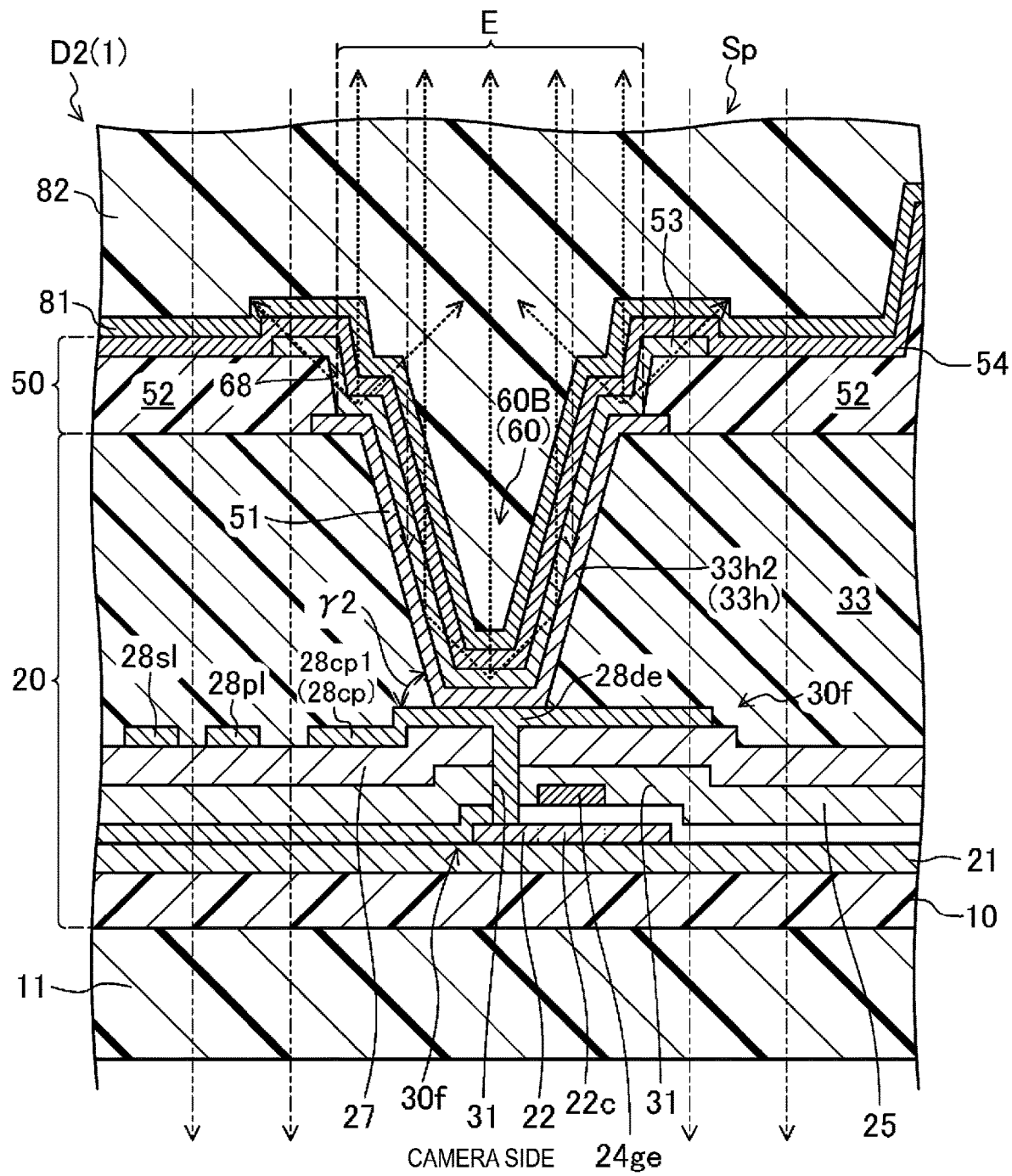
FIG. 18 is a cross-sectional view illustrating main portions in the second display region of the organic EL display device according to another embodiment.
Figure 19:
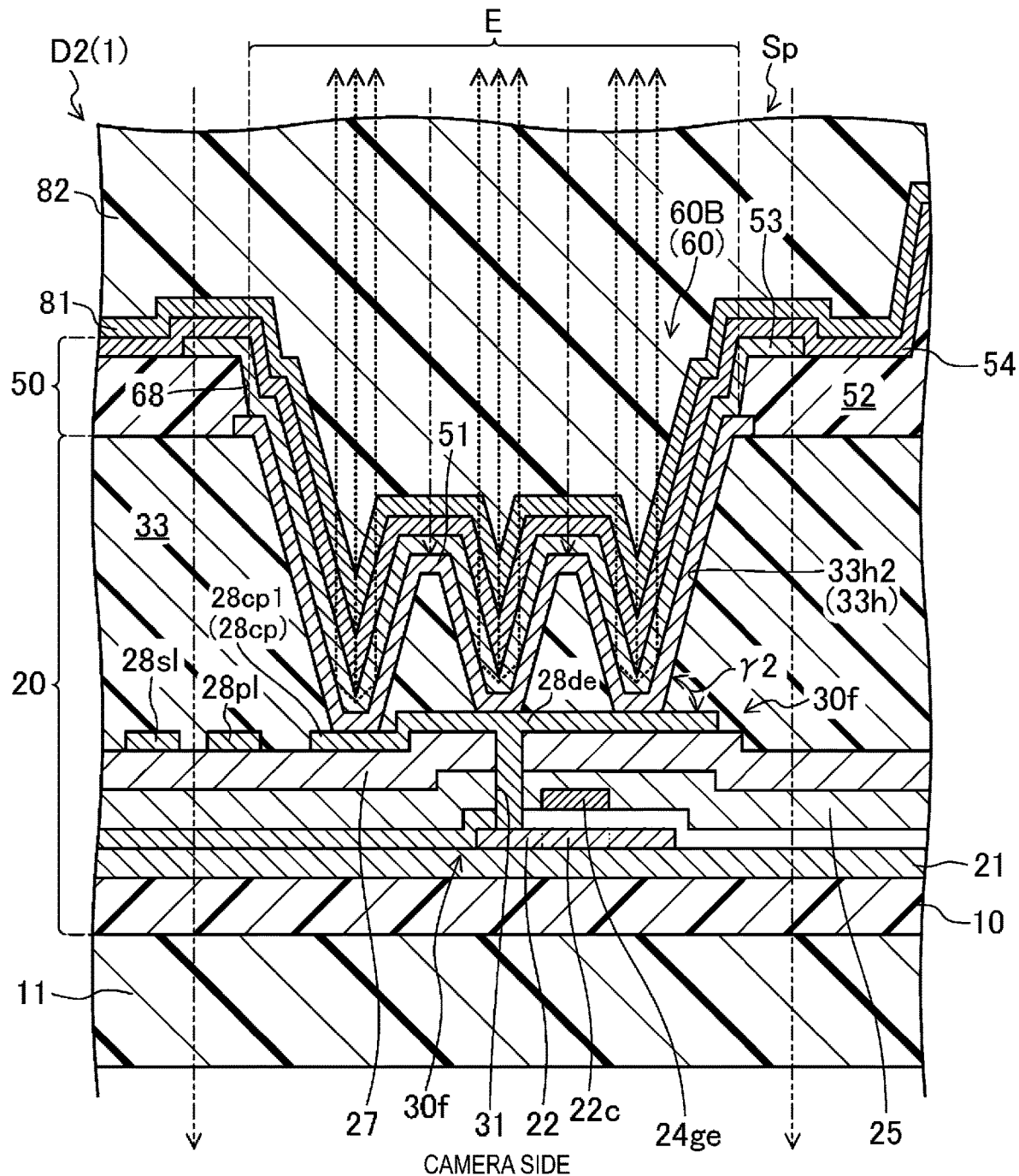
FIG. 19 is a cross-sectional view illustrating main portions in the second display region of the organic EL display device according to another embodiment.

FIG. 18 and FIG. 19 are each a cross-sectional view illustrating main portions in the second display region D2 of the organic EL display device 1 according to another embodiment.

In the organic EL display device 1 according to the first embodiment, the first and second modified examples thereof, the second embodiment, and the modified example thereof, the flattening film 33 has the two-layer configuration formed by the lower layer flattening film 34 and the upper layer flattening film 36, but as illustrated in FIG. 18, the flattening film 33 may have a single-layer configuration formed by only one coating film.

In this case, of the contact holes 33*h* provided for each of the organic EL elements 60 in the flattening film 33, in the first display region D1, the first contact hole (not illustrated) for connecting the first electrode 51 of the first organic EL element 60A to the sixth TFT 30*f* is formed at a position overlapping with the edge cover 52, and in the second display region D2, the second contact hole 33*h*2 for connecting the first electrode 51 of the second organic EL element 60B to the drain electrode 28*de* of the sixth TFT 30*f* is formed at a position corresponding to the opening 68 of the edge cover 52. Then, it is sufficient that the first electrode 51, the organic EL layer 53, and the second electrode 54 of the second organic EL element 60B be provided in a region including the inside of the second contact hole 33*h*2 in the flattening film 33.

Further, when the flattening film 33 has the single-layer configuration, as illustrated in FIG. 19, the plurality of second contact holes 33*h*2 may be formed for each of the second organic EL elements 60B in the flattening film 33. In this case, the first electrode 51 of the second organic EL element 60B is preferably connected to the drain electrode 28*de* of the sixth TFT 30*f* via each of the plurality of second contact holes 33*h*2. This is advantageous in increasing the substantial area of the portion in which the first electrode 51 is formed, and thus increasing the substantial area of the light-emitting portion of the second organic EL element 60B on the inner side of the opening 68 of the edge cover 52.

Even when the flattening film 33 has the single-layer configuration as illustrated in FIG. 18 and FIG. 19, from the perspective of increasing the substantial area of the light-emitting portion of the second organic EL element 60B, it is preferable that an inclination angle γ2 formed by the inner peripheral surface of the second contact hole 33*h*2 be less than an inclination angle of the inner peripheral surface of the first contact hole, with respect to the planar direction of the resin substrate layer 10.

As described above, the preferred embodiments and modified examples are described as examples of the technique of the disclosure. However, the technique of the disclosure is not limited to the embodiments and the modification examples, and is also applicable to an embodiment in which modification, replacement, adding, omission, and the like are suitably made. The constituent elements described in the embodiments described above can be combined into a new embodiment. The constituent elements described in the accompanying drawings and detailed description may also include constituent elements that are not essential for the purpose of solving the problems. As such, those constituent elements that are not essential should not be recognized as being essential immediately as described in the accompanying drawings and detailed description.

For example, the above-described embodiments and modified examples thereof may have a configuration to be described below.

The polyimide resin is illustrated as an example of the material of the lower layer flattening film 34 above, but the technique of the disclosure is not limited thereto. The lower layer flattening film 34 may be formed of an acrylic resin such as a polymethyl methacrylate resin (PMMA), for example. The acrylic resin is also preferably used as the material of the lower layer flattening film 34, from the perspective of increasing the transmittance of light.

The area of the organic EL layer 53 of the first organic EL element 60A and the area of the organic EL layer 53 of the second organic EL element 60B are equivalent to each other above, but the technique of the disclosure is not limited thereto. The area of the organic EL layer 53 of the first organic EL element 60A and the area of the organic EL layer 53 of the second organic EL element 60B are preferably equivalent to each other, but may be different from each other.

The organic EL layer 53 is individually provided for each of the subpixels Sp above, but the technique of the disclosure is not limited thereto. The organic EL layer 53, including the light-emitting layer 72, may be provided commonly for the plurality of subpixels Sp as a continuous layer. In this case, the organic EL display device 1 may include a color filter, for example, to perform color tone expression of each of the subpixels Sp.

Each of the pixels Px is constituted by the subpixels Sp of the three colors above, but the technique of the disclosure is not limited thereto. The subpixels Sp constituting each of the pixels Px are not limited to having the three colors, and may have four or more colors. Further, the subpixels Sp of the three colors constituting each of the pixels Px are provided in the stripe arrangement described above, but the technique of the disclosure is not limited thereto. The arrangement of the plurality of subpixels Sp constituting each of the pixels Px may be another arrangement such as a PenTile arrangement.

The first TFT 30a, the second TFT 30b, the third TFT 30c, the fourth TFT 30d, the fifth TFT 30e, the sixth TFT 30f, and the seventh TFT 30g are each the top-gate type above, but the technique of the disclosure is not limited thereto. The first TFT 30a, the second TFT 30b, the third TFT 30c, the fourth TFT 30d, the fifth TFT 30e, the sixth TFT 30f, and the seventh TFT 30g may each be a bottom gate type. Further, the TFT 30 provided for each of the subpixels Px may be six or less and eight or more.

The first electrode 51 is the anode electrode and the second electrode 54 is the cathode electrode above, but the technique of the disclosure is not limited thereto. The first electrode 51 may be the cathode electrode, and the second electrode 54 may be the anode electrode. In this case, the organic EL layer 53 has an inverted layered structure, for example.

The organic EL layer 53 has the five-layer layered structure formed by the hole injection layer 70, the hole transport layer 71, the light-emitting layer 72, the electron transport layer 73, and the electron injection layer 74 above, but the technique of the disclosure is not limited thereto. The organic EL layer 53 may have a three-layer layered structure formed by a hole injection-cum-transport layer, the light-emitting layer 72, and an electron transport-cum-injection layer, and can adopt any chosen structure.

As the electronic component used in combination with the organic EL display device 1, the camera 3 is illustrated as an example above, but the technique of the disclosure is not limited thereto. The electronic component may be another electronic component such as a fingerprint sensor or a face recognition sensor, as long as the electronic component is disposed at a position overlapping with the display region D in a plan view on the back face of the organic EL display device 1, and configured to utilize the light transmitted through the light-emitting element layer 50, the TFT layer 20, and the resin substrate layer 10.

The organic EL display device 1 is illustrated as an example of a display device above, but the technique of the disclosure is not limited thereto. The technique of the disclosure can be applied to a display device provided with a plurality of light-emitting elements driven by a current. For example, the technique of the disclosure is applicable to a display device provided with quantum-dot light emitting diodes (QLEDs), which are light-emitting elements using a quantum dot-containing layer.

The invention claimed is:

1. A display device comprising:
a substrate;
a thin film transistor layer provided on the substrate and including a plurality of thin film transistors;
a light-emitting element layer provided on the thin film transistor layer and including a plurality of light-emitting elements;
a display region configured to display an image by light emission from the plurality of light-emitting elements controlled by an action of the thin film transistor; and
an electronic component disposed on a back face side of the display region with respect to the substrate and configured to utilize light transmitted through the light-emitting element layer, the thin film transistor layer and the substrate,
wherein the thin film transistor layer further includes a flattening film covering the plurality of thin film transistors,
the light-emitting element layer includes a first electrode provided for each of the plurality of light-emitting elements on the flattening film, an edge cover covering a peripheral portion of the first electrode and including an opening exposing the first electrode, a light-emitting function layer provided on the first electrode inside the opening of the edge cover, and a second electrode provided on the light-emitting function layer,
the first electrode is electrically connected to the thin film transistor via a contact hole formed for each of the plurality of light-emitting elements in the flattening film,
the display region includes a first display region, and a second display region located inside the first display region and configured to transmit light utilized by the electronic component,
the plurality of light-emitting elements include a first light-emitting element located in the first display region and a second light-emitting element located in the second display region,
an area of the first electrode of the second light-emitting element is smaller than an area of the first electrode of the first light-emitting element,
of a plurality of the contact holes, a first contact hole configured to electrically connect the first electrode of the first light-emitting element to the thin film transistor is located at a position overlapping with the edge cover, and a second contact hole configured to electrically connect the first electrode of the second light-emitting element to the thin film transistor is located at a position corresponding to the opening of the edge cover, and the first electrode, the light-emitting function layer, and the second electrode of the second light-emitting element are provided in a region including an inside of the second contact hole in the flattening film.

2. The display device according to claim 1, wherein an opening area of the second contact hole is greater than an opening area of the first contact hole.

3. The display device according to claim 1, wherein an area of the light-emitting function layer of the first light-emitting element and an area of the light-emitting function layer of the second light-emitting element are equivalent to each other.

4. The display device according to claim 1, wherein each of the first contact hole and the second contact hole is widened toward a front face side on which an image is displayed in the display region, and includes an inner peripheral surface inclined at a predetermined inclination angle with respect to a planar direction of the substrate in the display region, and the inclination angle of the inner peripheral surface of the second contact hole is less than the inclination angle of the inner peripheral surface of the first contact hole.

5. The display device according to claim 1, wherein the flattening film includes a lower layer flattening film, and an upper layer flattening film provided on the lower layer flattening film, the thin film transistor layer further includes a relay conductive portion provided for each of the plurality of light-emitting elements on the lower layer flattening film and located in a lower layer than the upper layer flattening film, a plurality of the relay conductive portions include a first relay conductive portion configured to connect the first electrode of the first light-emitting element to the thin film transistor, and a second relay conductive portion configured to connect the first electrode of the second light-emitting element to the thin film transistor, the first relay conductive portion is connected to the first electrode via a first upper layer contact hole formed as the first contact hole in the upper layer flattening film, and is electrically connected to the thin film transistor via a first lower layer contact hole formed for each of the plurality of light-emitting elements in the lower layer flattening film, and the second relay conductive portion is connected to the first electrode via a second upper layer contact hole formed as the second contact hole in the upper layer flattening film, and is electrically connected to the thin film transistor via a second lower layer contact hole formed for each of the plurality of light-emitting elements in the lower layer flattening film.

6. The display device according to claim 5, wherein an area of the second relay conductive portion is greater than an area of the first relay conductive portion, and the second relay conductive portion is housed inside a region in which the first electrode of the second light-emitting element is provided in a plan view.

7. The display device according to claim 5, wherein each of the first lower layer contact hole and the second lower layer contact hole is widened toward the front face side on which the image is displayed in the display region, and includes an inner peripheral surface inclined at a predetermined inclination angle with respect to the planar direction of the substrate in the display region, and the inclination angle of the inner peripheral surface of the first lower layer contact hole is greater than the inclination angle of the inner peripheral surface of the second lower layer contact hole.

8. The display device according to claim 5, wherein the second lower layer contact hole is located at a position corresponding to the opening of the edge cover.

9. The display device according to claim 8, wherein an opening area of the second lower layer contact hole is greater than an opening area of the first lower layer contact hole.

10. The display device according to claim 8, wherein the thin film transistor layer further includes a connecting conductive portion provided for each of the plurality of light-emitting elements in a lower layer than the lower layer flattening film, a plurality of the connecting conductive portions include a first connecting conductive portion configured to connect the first relay conductive portion to the thin film transistor, and a second connecting conductive portion configured to connect the second relay conductive portion to the thin film transistor, an area of the second connecting conductive portion is greater than an area of the first connecting conductive portion, and the second connecting conductive portion is housed inside the region in which the first electrode of the second light-emitting element is provided in a plan view.

11. The display device according to claim 5, wherein the thin film transistor layer includes, in a lower layer than the lower layer flattening film, a semiconductor layer provided for each of the plurality of thin film transistors, a gate insulating film covering the semiconductor layer, a gate electrode provided at a position overlapping with the semiconductor layer on the gate insulating film, and an interlayer insulating film covering the gate electrode, and in the semiconductor layer of the thin film transistor electrically connected to the first electrode of the second light-emitting element, a channel region overlapping with the gate electrode entirely overlaps with the first electrode of the second light-emitting element.

12. The display device according to claim 5, wherein the upper layer flattening film is formed of an acrylic resin.

13. The display device according to claim 1, wherein a plurality of the second contact holes are formed for each of a plurality of the second light-emitting elements, and the first electrode of the second light-emitting element is electrically connected to the thin film transistor via each of the plurality of the second contact holes.

14. The display device according to claim 1, wherein the second contact hole is formed in a frame-like shape extending along a peripheral edge of the opening of the edge cover.

* * * * *